(12) United States Patent
Lee et al.

(10) Patent No.: US 11,638,383 B2
(45) Date of Patent: Apr. 25, 2023

(54) DISPLAY DEVICE AND METHOD OF MANUFACTURING THE SAME

(71) Applicant: Samsung Display Co., Ltd., Yongin-si (KR)

(72) Inventors: Jongchan Lee, Yongin-si (KR); Kibum Kim, Yongin-si (KR); Myeonghun Song, Yongin-si (KR); Jeonghyun Lee, Yongin-si (KR); Sanghee Jang, Yongin-si (KR); Woonghee Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

(21) Appl. No.: 16/892,963

(22) Filed: Jun. 4, 2020

(65) Prior Publication Data

US 2021/0159288 A1 May 27, 2021

(30) Foreign Application Priority Data

Nov. 21, 2019 (KR) .......................... 10-2019-0150493

(51) Int. Cl.
*H01L 51/56* (2006.01)

(52) U.S. Cl.
CPC ......... *H10K 59/122* (2023.02); *H10K 50/865* (2023.02); *H10K 59/1213* (2023.02); *H10K 59/1216* (2023.02); *H10K 59/131* (2023.02); *H10K 71/00* (2023.02); *H10K 2102/103* (2023.02)

(58) Field of Classification Search
CPC . H01L 27/3246; H01L 51/5284; H01L 51/56; H01L 2251/308
See application file for complete search history.

(56) References Cited

U.S. PATENT DOCUMENTS

| 9,634,074 B2 | 4/2017 | Son et al. |
| 10,332,945 B2 | 6/2019 | Kim |
| 2016/0126494 A1 | 5/2016 | Jung et al. |
| 2016/0172633 A1* | 6/2016 | Ahn ................... H01L 27/3272 |
| | | 257/40 |
| 2020/0105844 A1* | 4/2020 | Wang .................... H01L 27/326 |

FOREIGN PATENT DOCUMENTS

| KR | 10-2011-0058356 | 6/2011 |
| KR | 10-2016-0053001 | 5/2016 |
| KR | 10-2016-0096760 | 8/2016 |
| KR | 10-2018-0066948 | 6/2018 |

* cited by examiner

*Primary Examiner* — Fernando L Toledo
*Assistant Examiner* — Valerie N Newton
(74) *Attorney, Agent, or Firm* — Kile Park Reed & Houtteman PLLC

(57) ABSTRACT

A method of manufacturing a display device includes preparing a substrate, wherein the substrate includes a pixel area and a transmission area, forming insulating layers in the pixel area and in the transmission area, forming a pixel electrode on the insulating layers in the pixel area and forming a pixel-defining layer on the pixel electrode, wherein the pixel-defining layer exposes at least part of the pixel electrode, forming a metal layer on the pixel-defining layer in the pixel area, the at least part of the pixel electrode exposed by the pixel-defining layer in the pixel area, and the insulating layers in the transmission area, removing the metal layer on the insulating layers in the transmission area, and removing the insulating layers in the transmission area.

19 Claims, 17 Drawing Sheets

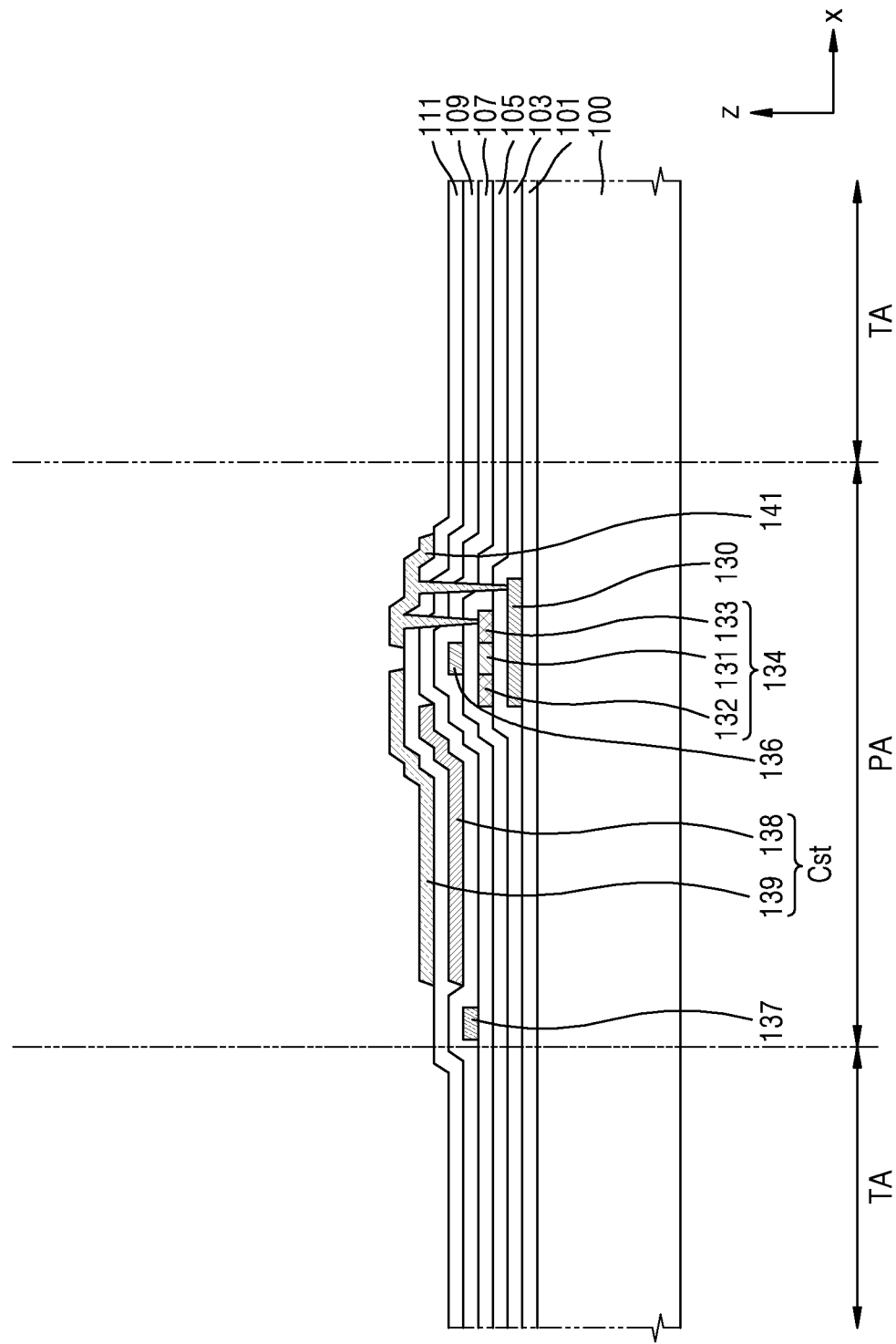

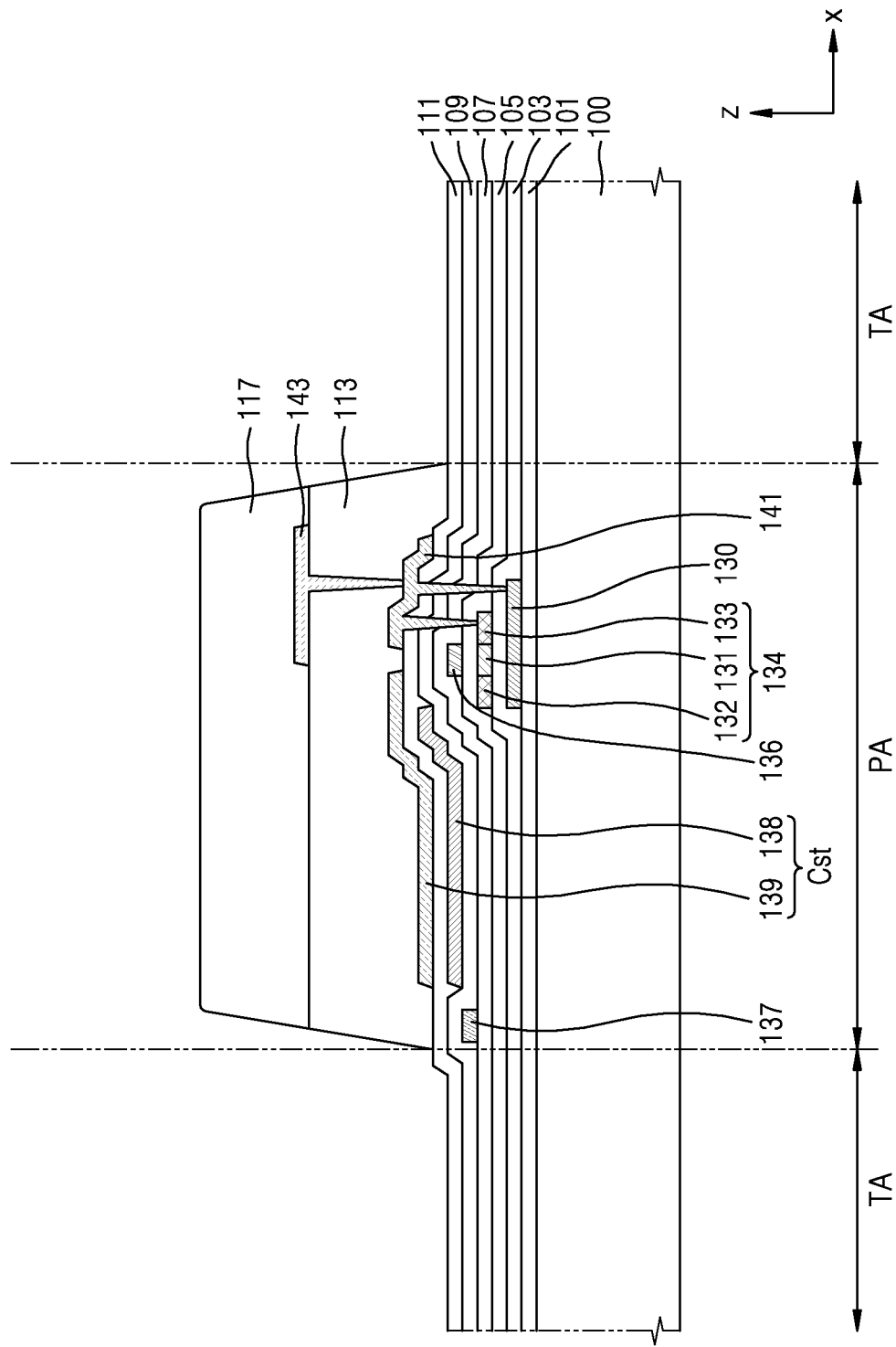

DISPLAY DEVICE AND METHOD OF MANUFACTURING THE SAME

CROSS-REFERENCE TO RELATED APPLICATIONS

This application claims priority to and benefits of Korean Patent Application No. 10-2019-0150493 under 35 U.S.C. § 119, filed on Nov. 21, 2019, in the Korean Intellectual Property Office, the entire contents of which are incorporated herein by reference.

BACKGROUND

1. Technical Field

One or more embodiments relate to a display device and a method of manufacturing the same, and, to a display device having increased reliability of a product and a method of manufacturing the display device.

2. Description of Related Art

The applicability and usages of display devices are increasingly becoming more diverse. As the thicknesses and weights of the display devices have decreased, the range of usage thereof is broadening.

For example, the display devices may be used in various manners, for example, the display devices may be used as display units for small products, such as mobile phones, display units for large products, such as televisions (TVs), and for example, as head up displays (HUDs) for vehicles or electronic devices for artificial intelligence (AI). With respect to these display devices, transparent display devices having a property of transmitting light are required according to application.

In display devices according to the related art, it may be difficult to increase transmittance more than a certain degree due to insulating layers arranged in the transmission area TA. When the insulating layers arranged in the transmission area TA are removed, a difference in heights of layers arranged in the pixel area PA and in the transmission area TA may be increased. Thus, organic materials used to form the planarization layers in the pixel area PA may be lost.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device in which a loss of organic materials may be prevented and simultaneously high transmittance may be achieved. However, these objectives are just examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a method of manufacturing a display device, may include preparing a substrate including a pixel area and a transmission area, forming a plurality of insulating layers in the pixel area and in the transmission area, forming a pixel electrode on the plurality of insulating layers in the pixel area, forming a pixel-defining layer on the pixel electrode, wherein the pixel-defining layer may expose at least part of the pixel electrode, forming a metal layer on the pixel-defining layer in the pixel area, the at least part of the pixel electrode exposed by the pixel-defining layer in the pixel area, and the plurality of insulating layers in the transmission area, removing the metal layer on the plurality of insulating layers in the transmission area, and removing the plurality of insulating layers in the transmission area.

The method may further include removing the metal layer on the pixel-defining layer in the pixel area, and removing the metal layer on the at least part of the pixel electrode exposed by the pixel-defining layer in the pixel area.

In the forming of the metal layer, the forming of the metal layer may include forming the metal layer of a thickness in a range of about 400 Å to about 1200 Å.

The metal layer may include at least one of indium zinc oxide (IZO), indium tin oxide (ITO), zinc oxide (ZnO), indium oxide ($In_2O_3$), indium gallium oxide (IGO), and aluminum zinc oxide (AZO).

The removing of the metal layer on the plurality of insulating layers in the transmission area may include patterning a photosensitive material on the metal layer in the pixel area, removing the metal layer on the plurality of insulating layers in the transmission area, and removing the patterned photosensitive material on the metal layer in the pixel area.

The removing of the metal layer on the plurality of insulating layers in the transmission area may include removing the metal layer in the transmission area by wet etching.

The removing of the plurality of insulating layers in the transmission area may include removing the plurality of insulating layers in the transmission area by dry etching.

The removing of the metal layer on the pixel-defining layer in the pixel area and on the at least part of the pixel electrode exposed by the pixel-defining layer in the pixel area may include removing the metal layer by wet etching.

The forming of the plurality of insulating layers in the pixel area and in the transmission area may include forming a buffer layer in the pixel area and in the transmission area, forming a light-shielding layer on the buffer layer in the pixel area, forming a first insulating layer on the light-shielding layer in the pixel area and on the buffer layer in the transmission area, forming a semiconductor layer on the first insulating layer in the pixel area, forming a second insulating layer on the semiconductor layer in the pixel area and on the first insulating layer in the transmission area, forming a first conductive layer on the second insulating layer in the pixel area, forming a third insulating layer on the first conductive layer in the pixel area and on the second insulating layer in the transmission area, forming a second conductive layer on the third insulating layer in the pixel area, forming a fourth insulating layer on the second conductive layer in the pixel area and on the third insulating layer in the transmission area, forming a third conductive layer on the fourth insulating layer in the pixel area, forming a fifth insulating layer on the third conductive layer in the pixel area and on the fourth insulating layer in the transmission area, and forming a fourth conductive layer and a fifth conductive layer on the fifth insulating layer in the pixel area.

The method may further include, forming a first planarization layer on the fourth conductive layer and the fifth conductive layer in the pixel area, forming a sixth conductive layer on the first planarization layer in the pixel area, and forming a second planarization layer on the sixth conductive layer in the pixel area.

The method may further include forming of the fourth conductive layer to face the third conductive layer.

The method may further include forming of the second conductive layer to face the first conductive layer.

The method may further include forming an intermediate layer on the pixel electrode after removing the metal layer on the at least part of the pixel electrode exposed by the pixel-defining layer in the pixel area; and forming an opposite electrode on the intermediate layer.

The method may further include forming of the opposite electrode to extend into the transmission area.

The pixel area may have a first transmittance, and the transmission area may have a second transmittance higher than the first transmittance.

According to one or more embodiments, a display device may include a substrate including a pixel area and a transmission area, a plurality of insulating layers disposed in the pixel area, a plurality of planarization layers disposed on the plurality of insulating layers, a pixel electrode disposed on the plurality of planarization layers, and a pixel-defining layer disposed on the pixel electrode and exposing at least part of the pixel electrode, wherein the plurality of insulating layers in the transmission area are removed.

The plurality of insulating layers may include a first insulating layer disposed on the substrate, a second insulating layer disposed on the first insulating layer, a third insulating layer disposed on the second insulating layer, a fourth insulating layer disposed on the third insulating layer, and a fifth insulating layer disposed on the fourth insulating layer, and the plurality of planarization layer may include a first planarization layer disposed on the fifth insulating layer and a second planarization layer disposed on the first planarization layer.

The display device may further include an intermediate layer disposed on the pixel electrode and an opposite electrode disposed on the intermediate layer.

At least part of the opposite electrode may extend into the transmission area.

The pixel area may have a first transmittance, and the transmission area may have a second transmittance higher than the first transmittance.

Other aspects, features, and advantages than the above-described aspects, features, and advantages will be apparent from the detailed description, the claims, and the drawings.

BRIEF DESCRIPTION OF THE DRAWINGS

The above and other aspects, features, and advantages of embodiments will be more apparent from the following description taken in conjunction with the accompanying drawings, in which:

FIGS. 11A through 11H are schematic cross-sectional views schematically illustrating a process of manufacturing a display device according to an embodiment.

DETAILED DESCRIPTION OF THE EMBODIMENTS

Figure 1:
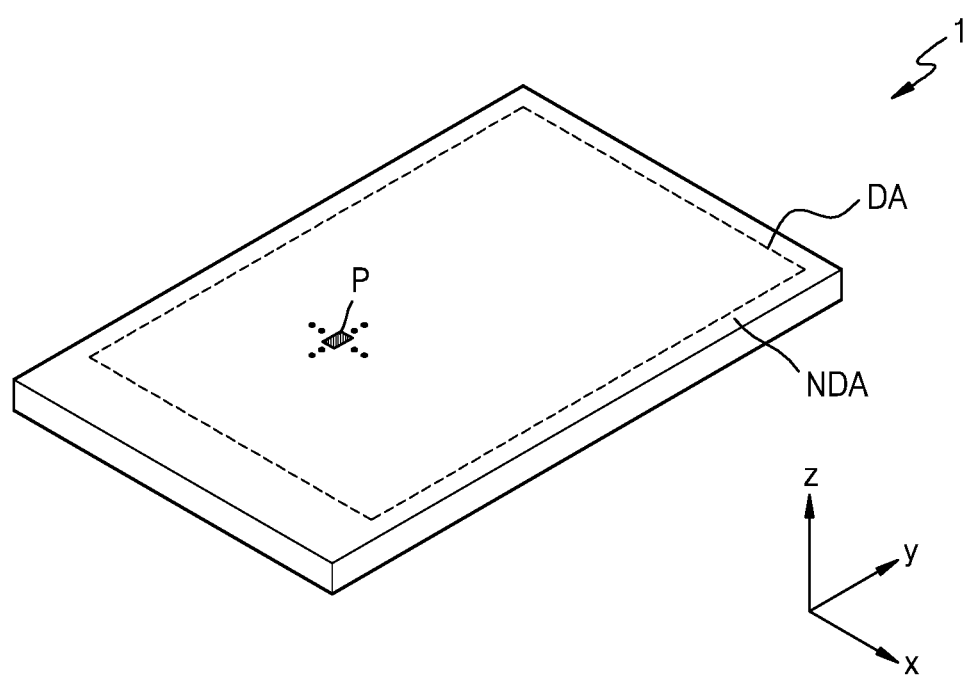
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described below in more detail with reference to the accompanying drawings. Those components that are the same or are in correspondence are rendered the same reference numeral regardless of the figure number, and a redundant description therewith may be omitted.

Some of the parts which are not associated with the description may not be provided in order to describe embodiments of the disclosure and like reference numerals refer to like elements throughout the specification.

It will be understood that although the terms "first," "second," etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" "includes" and/or "including" used herein specify the presence of stated features or components, but do not preclude the presence or addition of one or more other features or components. It will be understood that when a layer, region, or component is referred to as being "formed on," another layer, region, or component, it may be directly or indirectly formed on the other layer, region, or component. That is, for example, intervening layers, regions, or components may be present. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When an embodiment may be implemented differently, a specific process order may be performed differently from the described order. For example, two consecutively described processes may be performed substantially at the same time or performed in an order opposite to the described order.

FIG. 1 is a perspective view schematically illustrating a display device according to an embodiment.

Referring to FIG. 1, a display device 1 may include a display area DA and a non-display area NDA around the display area DA. The non-display area NDA may surround the display area DA. The display device 1 may provide an image or images using light emitted from pixels P arranged or disposed in the display area DA. The non-display area NDA may be a region in which no image or images may be displayed.

Hereinafter, an organic light-emitting display device will be described as an example of a display device 1 according to an embodiment. However, a display device according to the disclosure is not limited thereto. In an embodiment, the display device 1 according to the disclosure may include an inorganic light-emitting display device (an inorganic light-emitting display or inorganic electroluminescence (EL) display), or a quantum dot light-emitting display device. For example, an emission layer of a display element provided or disposed in the display device 1 may include an organic material, an inorganic material, quantum dots, an organic material and quantum dots, or an inorganic material and a quantum dot.

Although the display device 1 having a flat display surface may be shown in FIG. 1, embodiments are not limited thereto. In an embodiment, the display device 1 may include a stereoscopic display surface or curved display surface.

When the display device 1 includes a stereoscopic display surface, the display device 1 may include display areas that may indicate different directions and may also include, for example, polygonal columnar display surfaces. In an embodiment, when the display device 1 includes a curved display surface, the display device 1 may be implemented with various shapes of display devices, such as flexible, foldable, bendable or rollable display devices.

In FIG. 1, the display device 1 that may be applied to a mobile phone terminal device, is shown. Although not shown, electronic modules mounted on a main board, a camera module, and a power module may be arranged or disposed on a bracket/case together with the display device 1. Thus, the mobile phone terminal device may be configured. The display device 1 according to the disclosure may be applied to large electronic devices, such as televisions (TVs) or monitors, or small and medium electronic devices, such as tablets, navigation devices, game consoles, or smart watches.

In FIG. 1, the display area DA of the display device 1 may have a rectangular shape. However, the shape of the display area DA may be a circular shape, an oval shape, or a polygonal shape, such as a triangular or pentagonal shape or other shapes within the spirit and the scope of the disclosure.

Figure 2:
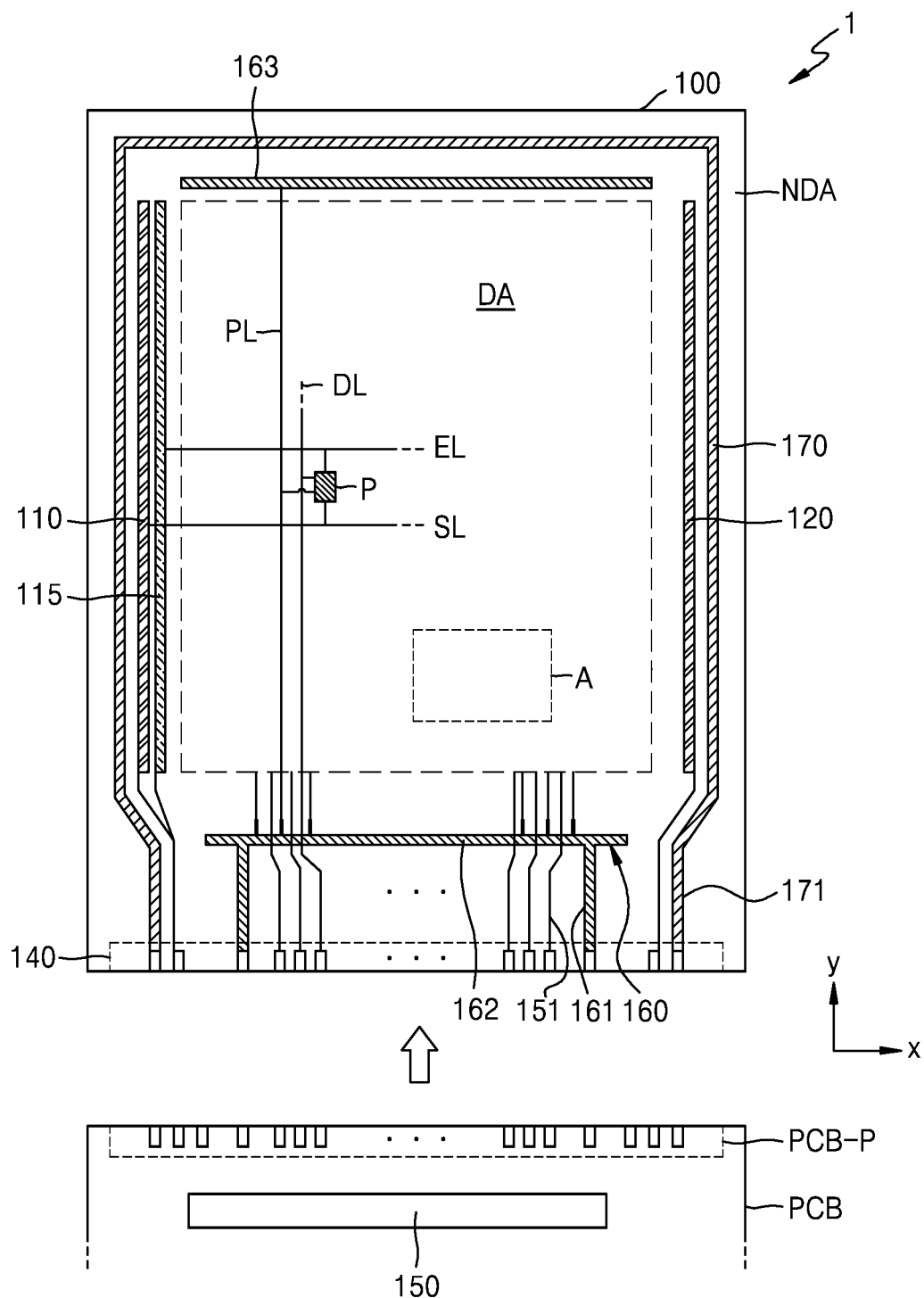
FIG. 2 is a plan view schematically illustrating a display device according to an embodiment.

FIG. 2 is a plan view schematically illustrating a display device according to an embodiment.

Referring to FIG. 2, a display device 1 may include pixels P arranged or disposed in the display area DA. Each of the pixels P may include a display element, such as an organic light-emitting diode OLED. Each of the pixels P may emit red, green, blue, or white light, for example, through the organic light-emitting diode OLED. The pixel P used herein may be understood as a pixel that emits one of red, green, blue, and white light, as described above.

Each pixel P may be electrically connected to outer circuits arranged or disposed in the non-display area NDA. A first scan driving circuit 110, a first emission driving circuit 115, a second scan driving circuit 120, a terminal 140, a data driving circuit 150, a first power supply line 160, and a second power supply line 170 may be arranged or disposed in the non-display area NDA.

The first scan driving circuit 110 may provide a scan signal to each pixel P via a scan line SL. The first emission driving circuit 115 may provide an emission control signal to each pixel P via an emission control line EL. The second scan driving circuit 120 may be arranged or disposed in parallel to the first scan driving circuit 110 with the display area DA therebetween. Some of the pixels P arranged or disposed in the display area DA may be electrically connected to the first scan driving circuit 110, and other pixels may be electrically connected to the second scan driving circuit 120. In an embodiment, a second emission driving circuit (not shown) may be arranged or disposed in parallel to the first emission driving circuit 115 with the display area DA therebetween.

The first emission driving circuit 115 may be apart from the first scan driving circuit 110 in an x-direction and arranged or disposed in the non-display area NDA. In an embodiment, the first emission driving circuit 115 may be arranged or disposed alternately with the first scan driving circuit 110 in a y-direction.

The terminal 140 may be arranged or disposed on one side of a substrate 100. The terminal 140 may not be covered by or overlapped by an insulating layer but may be exposed and thus may be electrically connected to a printed circuit board PCB. A terminal PCB-P of the printed circuit board PCB may be electrically connected to the terminal 140 of the display device 1. The printed circuit board PCB may deliver signals or power of a controller (not shown) to the display device 1. Control signals generated by the controller (not shown) may be delivered to each of the first and second scan driving circuits 110 and 120 and the first emission driving circuit 115 through the printed circuit board PCB. The controller may provide first and second power to each of the first and second power supply lines 160 and 170 via each of first and second connection lines 161 and 171. A first power supply voltage ELVDD may be provided to a pixel P via a driving voltage line PL electrically connected to the first power supply line 160, and a second power supply voltage ELVSS may be provided to an opposite electrode of a pixel P electrically connected to the second power supply line 170.

The data driving circuit 150 may be electrically connected to a data line DL. Data signals of the data driving circuit 150 may be provided to each pixel P via a connection line 151 electrically connected to the terminal 140 and the data line DL electrically connected to the connection line 151.

FIG. 2 illustrates that the data driving circuit 150 may be arranged or disposed on the printed circuit board PCB. However, in an embodiment, the data driving circuit 150 may be arranged or disposed on the substrate 100. For example, the data driving circuit 150 may be arranged or disposed between the terminal 140 and the first power supply line 160.

The first power supply line 160 may include a first sub-line 162 and a second sub-line 163, which may extend in parallel to each other in the x-direction with the display area DA therebetween. The second power supply line 170 may have a shape of a loop with one open side and may partially surround the display area DA.

Figure 3:
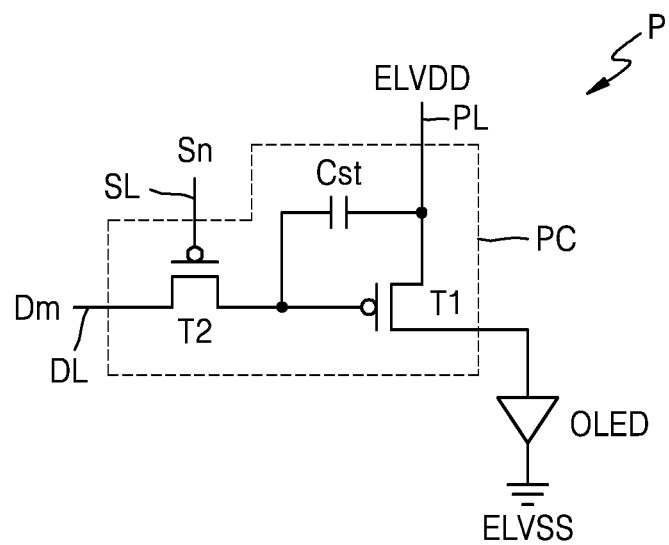
FIG. 3 is an equivalent circuit diagram of pixels that may be included in a display device according to an embodiment.

FIG. 3 is an equivalent circuit diagram of a pixel that may be included in a display device according to an embodiment.

Referring to FIG. 3, each pixel P may include a pixel circuit PC electrically connected to the scan line SL and the data line DL and an organic light-emitting diode OLED electrically connected to the pixel circuit PC.

The pixel circuit PC may include a driving thin-film transistor T1, a switching thin-film transistor T2, and a storage capacitor Cst. The switching thin-film transistor T2 may be electrically connected to the scan line SL and the data line DL and may deliver a data signal Dm, which may be input via the data line DL according to a scan signal Sn input via the scan line SL, to the driving thin-film transistor T1.

The storage capacitor Cst may be electrically connected to the switching thin-film transistor T2 and a driving voltage line PL and store a voltage corresponding to a difference between the voltage received from the switching thin-film transistor T2 and the first power supply voltage ELVDD (or a driving voltage) supplied to the driving voltage line PL.

The driving thin-film transistor T1 may be electrically connected to the driving voltage line PL and the storage capacitor Cst and may control a driving current that flows through the organic light-emitting diode OLED from the driving voltage line PL in correspondence with a voltage value stored in the storage capacitor Cst. The organic light-emitting diode OLED may emit light with certain brightness according to the driving current.

In FIG. 3, the pixel circuit PC may include two thin-film transistors and one storage capacitor. However, embodiments are not limited thereto. In an embodiment, there may be various modifications in which the pixel circuit PC includes seven thin-film transistors and one storage capacitor or three thin-film transistors and two storage capacitors.

Figure 4:
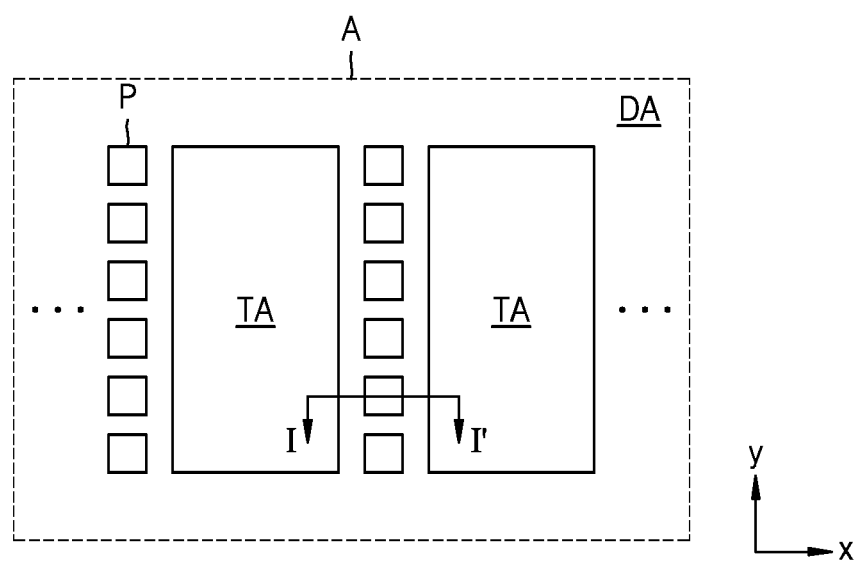
FIG. 4 is a plan view schematically illustrating a display device according to an embodiment.
Figure 5:
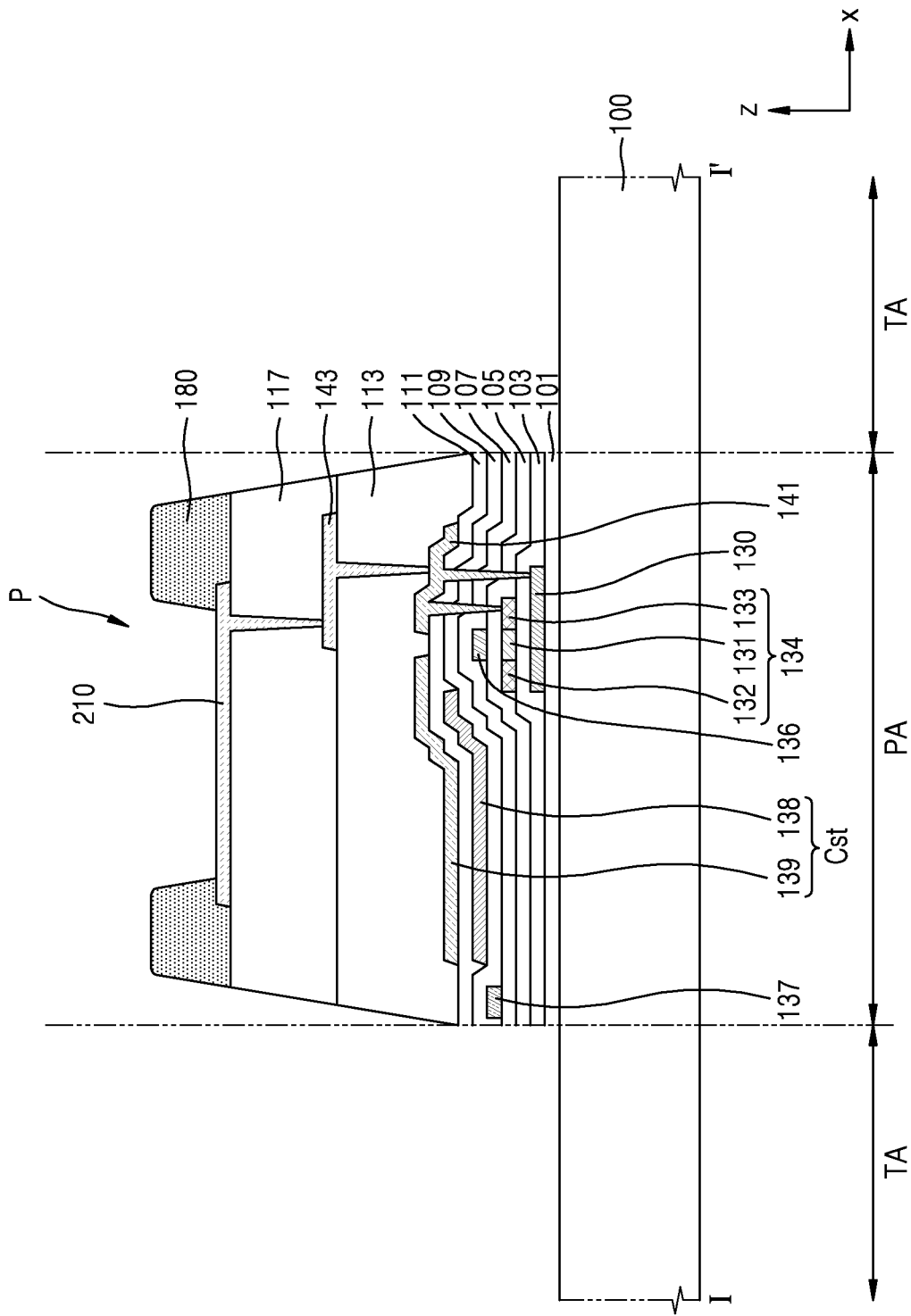
FIG. 5 is a schematic cross-sectional view schematically illustrating a display device according to an embodiment.

FIG. 4 is a plan view schematically illustrating a display device according to an embodiment, and FIG. 5 is a schematic cross-sectional view schematically illustrating a display device according to an embodiment.

In more detail, FIG. 4 is an enlarged view of region A of FIG. 2, and FIG. 5 is a schematic cross-sectional view of a display device cut along line I-I' of FIG. 4.

Referring to FIGS. 4 and 5, a display area DA of a display device according to an embodiment may include a pixel area PA, in which pixels P may be arranged or disposed and light may be emitted, and a transmission area or areas TA, in which no pixels P may be arranged or disposed and no light may be emitted. In order to increase transmittance of the display device, a transmission area or areas TA may be greater or larger than the pixel area PA including the pixels P. FIG. 4 illustrates that six pixels P may be arranged or disposed in the y-direction in correspondence with one transmission area TA. However, there may be various modifications in which, in an embodiment, four pixels P may be arranged or disposed in correspondence with one transmission area TA.

The substrate 100 may include the pixel area PA and the transmission areas TA. The substrate 100 may include a glass material having a main component of silicon oxide ($SiO_2$) or polymer resin. The polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the polymer resin described above and an inorganic layer (not shown). The substrate 100 may be a transparent window or other transparent structure and may include other materials within the spirit and the scope of the disclosure.

A thin-film transistor including a gate electrode, a source electrode, and a drain electrode and a storage capacitor including an upper electrode and a lower electrode may be arranged or disposed on the substrate 100.

A buffer layer 101 may be arranged or disposed on the substrate 100, may reduce or prevent penetration of foreign substances, moisture, or external air from a lower portion of the substrate 100, and may provide a flat surface on the substrate 100. The buffer layer 101 may include an inorganic material such as oxide or nitride, an organic material, or an organic/inorganic composite material and may have a single layer or multi-layer structure of the inorganic material and the organic material. A barrier layer (not shown) that may prevent penetration of external air may be included between the substrate 100 and the buffer layer 101.

A light-shielding layer 130 may be arranged or disposed on the buffer layer 101. The light-shielding layer 130 may be arranged or disposed to correspond to a thin-film transistor and may prevent the gate electrode, the source electrode, and the drain electrode of the thin-film transistor from being observed from the outside. A voltage may be applied to the light-shielding layer 130. For example, the light-shielding layer 130 may be electrically connected to the source electrode or the drain electrode of the thin-film transistor. The light-shielding layer 130 may be linked to an electrical potential of the source electrode or the drain electrode of the thin-film transistor so that a voltage may be supplied to the light-shielding layer 130. Thus, the thin-film transistor of the display device may be stabilized. In an embodiment, the light-shielding layer 130 may not be electrically connected to the source electrode or drain electrode of the thin-film transistor but may be electrically connected to an additional line.

A first insulating layer 103 may be arranged or disposed on the light-shielding layer 130. The first insulating layer 103 may be arranged or disposed in the pixel area PA but may not be arranged or disposed in the transmission areas TA. For example, the first insulating layer 103 may be arranged or disposed in the transmission areas TA and then removed by a subsequent process. The first insulating layer 103 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multi-layer structure including the inorganic insulating materials described above.

A semiconductor layer 134 may be arranged or disposed on the first insulating layer 103. The semiconductor layer 134 may include a channel region 131 that that may overlap a first conductive layer 136, and a source region 132 and a drain region 133, which may be at both sides of the channel region 131 and include an impurity with a higher concentration than a concentration of the channel region 131. Here, the impurity may include an N-type impurity or a P-type impurity. The source region 132 and the drain region 133 may be electrically connected to the source electrode and the drain electrode, respectively.

The semiconductor layer 134 may include an oxide semiconductor and/or a silicon semiconductor. When the semiconductor layer 134 includes an oxide semiconductor, the semiconductor layer 134 may include, for example, an oxide of at least one material selected from among indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include InSnZnO (ITZO) or InGaZnO (IGZO). When the semiconductor layer 134 includes a silicon semiconductor, the semiconductor layer 134 may include, for example, amorphous silicon (a-Si) or low temperature poly-silicon (LTPS) in which a-Si is crystallized.

A second insulating layer 105 may be arranged or disposed on the semiconductor layer 134. The second insulating layer 105 may be arranged or disposed in the pixel area PA but may not be arranged or disposed in the transmission areas TA. For example, the second insulating layer 105 may be arranged or disposed in the transmission areas TA and then removed by a subsequent process. The second insulating layer 105 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single layer or multi-layer structure including the inorganic insulating materials described above.

The first conductive layer 136 may be arranged or disposed on the second insulating layer 105. The first conductive layer 136 may have a single layer or multi-layer structure including one or more metals selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first conductive layer 136 may be electrically connected to a gate line for applying an electrical signal to the first conductive layer 136. In an embodiment, the first conductive layer 136 may be the gate electrode of the thin-film transistor.

A third insulating layer 107 may be arranged or disposed on the first conductive layer 136. The third insulating layer 107 may be arranged or disposed in the pixel area PA but may not be arranged or disposed in the transmission areas TA. For example, the third insulating layer 107 may be arranged or disposed in the transmission areas TA and then removed by a subsequent process. The third insulating layer 107 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single layer or multi-layer structure including the inorganic insulating materials described above.

A second conductive layer 137 may be arranged or disposed on the third insulating layer 107. The second conductive layer 137 may have a single layer or multi-layer structure including one or more metals selected from among Al, Pt, Pd, Ag, Mg, Au, Ni, Nd, Ir, Cr, Li, Ca, Mo, Ti, W, and Cu. The second conductive layer 137 may be electrically connected to a gate line for applying an electrical signal to the second conductive layer 137. In an embodiment, the second conductive layer 137 may be one of the gate electrode, the scan line SL, and the emission control line EL.

A fourth insulating layer 109 may be arranged or disposed on the second conductive layer 137. The fourth insulating layer 109 may be arranged or disposed in the pixel area PA but may not be arranged or disposed in the transmission areas TA. For example, the fourth insulating layer 109 may be arranged or disposed in the transmission areas TA and then removed by a subsequent process. The fourth insulating layer 109 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The fourth insulating layer 109 may have a single layer or multi-layer structure including the inorganic insulating materials described above.

A third conductive layer 138 may be arranged or disposed on the fourth insulating layer 109. The third conductive layer 138 may have a single layer or multi-layer structure including one or more metals selected from among Al, Pt, Pd, Ag, Mg, Au, Ni, Nd, Ir, Cr, Li, Ca, Mo, Ti, W, and Cu. The third conductive layer 138 may be electrically connected to a gate line for applying an electrical signal to the third conductive layer 138.

A fifth insulating layer 111 may be arranged or disposed on the third conductive layer 138. The fifth insulating layer 111 may be arranged or disposed in the pixel area PA but may not be arranged or disposed in the transmission areas TA.

For example, the fifth insulating layer 111 may be arranged or disposed in the transmission areas TA and then removed by a subsequent process. The fifth insulating layer 111 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The fifth insulating layer 111 may have a single layer or multi-layer structure including the inorganic insulating materials described above.

The fourth conductive layer 139 and the fifth conductive layer 141 may be arranged or disposed on the fifth insulating layer 111. The fourth conductive layer 139 and the fifth conductive layer 141 may have a single layer or multi-layer structure including one or more metals selected from among Al, Pt, Pd, Ag, Mg, Au, Ni, Nd, Ir, Cr, Li, Ca, Mo, Ti, W, and Cu. The fourth conductive layer 139 and the fifth conductive layer 141 may be electrically connected to a gate line for applying an electrical signal to the fourth conductive layer 139 and the fifth conductive layer 141.

The fourth conductive layer 139 and the fifth conductive layer 141 may be apart from each other and may be arranged or disposed on the same layer. In an embodiment, each of the fourth conductive layer 139 and the fifth conductive layer 141 may be the source electrode or drain electrode of the thin-film transistor. In FIG. 5, two conductive layers may be arranged or disposed on the fifth insulating layer 111. However, four or six conductive layers may also be arranged or disposed on the fifth insulating layer 111.

The third conductive layer 138 and the fourth conductive layer 139 may face each other with the fifth insulating layer 111 therebetween. Thus, a storage capacitor Cst, in which the third conductive layer 138 may be a lower electrode and the fourth conductive layer 139 may be an upper electrode, may be configured. The storage capacitor Cst may be configured with a large area through the third conductive layer 138 and the fourth conductive layer 139 so that the accumulated capacity of the storage capacitor Cst may be increased.

A first planarization layer 113 may be arranged or disposed on the fourth conductive layer 139 and the fifth conductive layer 141. The first planarization layer 113 may have a single layer or multi-layer structure including a layer including an organic material or inorganic material. The first planarization layer 113 may include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof. Moreover, the first planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the first planarization layer 113 is formed, chemical and mechanical polishing may be performed to provide a flat top surface.

A sixth conductive layer 143 may be arranged or disposed on the first planarization layer 113. The sixth conductive layer 143 may have a single layer or multi-layer structure including one or more metals selected from among Al, Pt, Pd, Ag, Mg, Au, Ni, Nd, Ir, Cr, Li, Ca, Mo, Ti, W, and Cu.

A second planarization layer 117 may be arranged or disposed on the sixth conductive layer 143. The second planarization layer 117 may have a single layer or multi-layer structure including a layer including an organic material or inorganic material. The second planarization layer 117 may include a general-purpose polymer, such as BCB, polyimide, HMDSO, PMMA, or PS, a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof. For example, the second planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the second planarization layer 117 is formed, chemical and mechanical polishing may be performed to provide a flat top surface.

A pixel electrode 210 may be arranged or disposed on the second planarization layer 117. The pixel electrode 210 may include a (semi-)light-transmitting electrode or reflective electrode. The pixel electrode 210 may include a reflective layer including Ag, Mg, Al, Pt, Pd, Au, Ni, Nd, Ir, and Cr and a compound thereof, and a transparent or semi-transparent electrode layer on the reflective layer. The transparent or semi-transparent electrode layer may include at least one selected from among indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stacked structure of ITO/Ag/ITO, for example.

A pixel-defining layer 180 may be arranged or disposed on the second planarization layer 117. The pixel-defining layer 180 may have an opening exposing at least part of the pixel electrode 210. The pixel-defining layer 180 may increase a distance between ends of the pixel electrode 210 and the opposite electrode (see 230 of FIG. 10) at an upper portion of the pixel electrode 210. Thus, an arc may be prevented from occurring in the ends of the pixel electrode 210. The pixel-defining layer 180 may include organic insulating materials, for example, polyimide, polyamide, acryl resin, BCB, HMDSO, and phenol resin and may be formed using a method such as spin coating.

Insulating layers and planarization layers may be arranged or disposed in the pixel area PA but not in the transmission areas TA. Thus, the pixel area PA may have a first transmittance, and the transmission areas TA may have a second transmittance that may be higher than the first transmittance.

Figure 6:
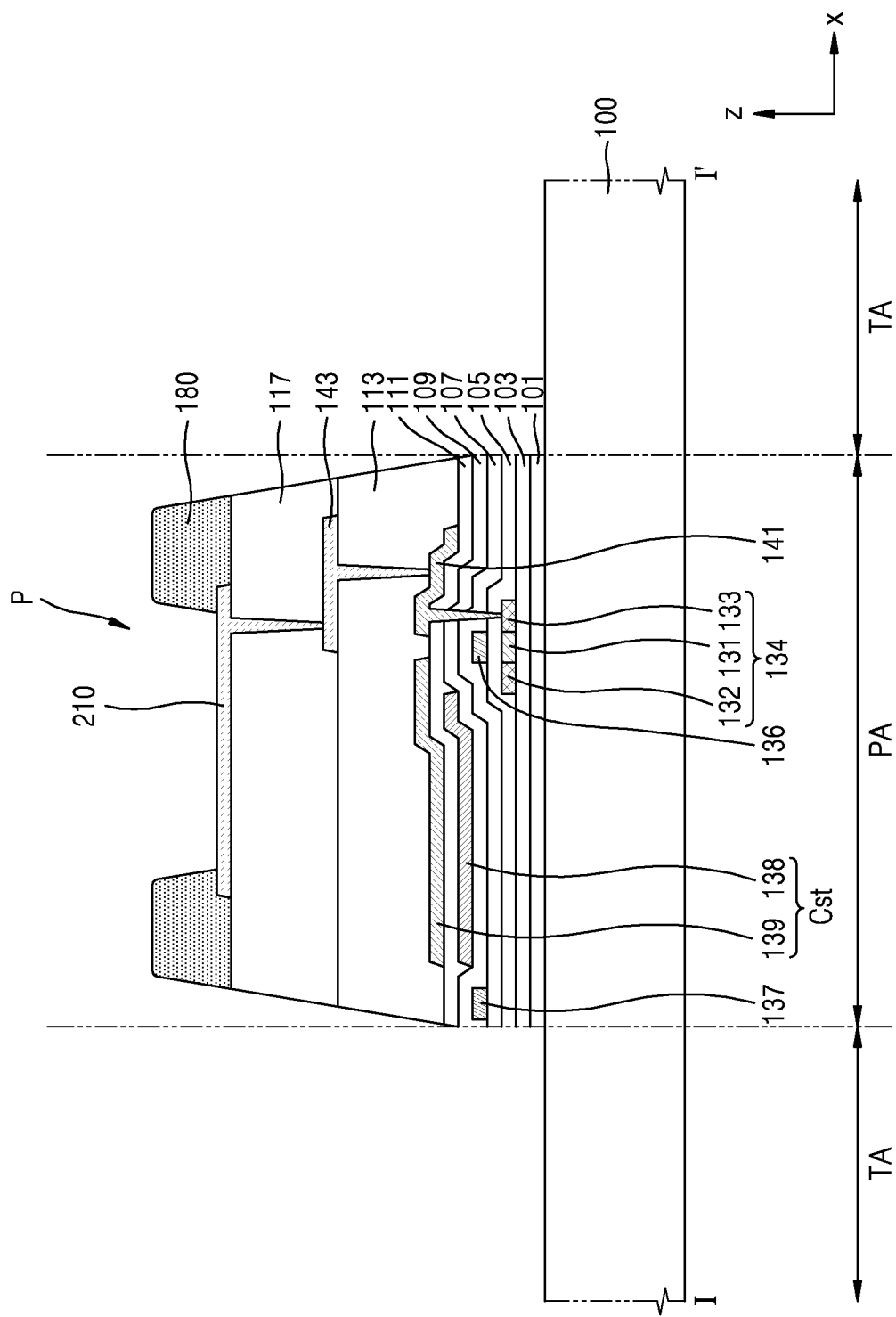
FIG. 6 is a schematic cross-sectional view schematically illustrating a display device according to an embodiment.

FIG. 6 is a schematic cross-sectional view schematically illustrating a display device according to an embodiment. An embodiment of FIG. 6 may be different from the embodiment of FIG. 5 in that a light-shielding layer 130 may not be arranged or disposed on a buffer layer 101. With respect to the same elements of FIG. 6 as those of FIG. 5, description thereof will be omitted, and hereinafter, only a difference therebetween will be described.

Referring to FIG. 6, the buffer layer 101 may be arranged or disposed on the substrate 100, and a first insulating layer 103 may be arranged or disposed on the buffer layer 101, and a semiconductor layer 134 may be arranged or disposed on the first insulating layer 103. In an embodiment, the first insulating layer 103 may be omitted between the buffer layer 101 and the semiconductor layer 134.

The light-shielding layer 130 may be omitted between the buffer layer 101 and the first insulating layer 103. Thus, a process of manufacturing a display device may be simplified, and a height between the substrate 100 and planarization layers (a first planarization layer 113 and a second planarization layer 117) may be reduced so that a loss of organic materials used to form the first planarization layer 113 and the second planarization layer 117 may be reduced.

Figure 7:
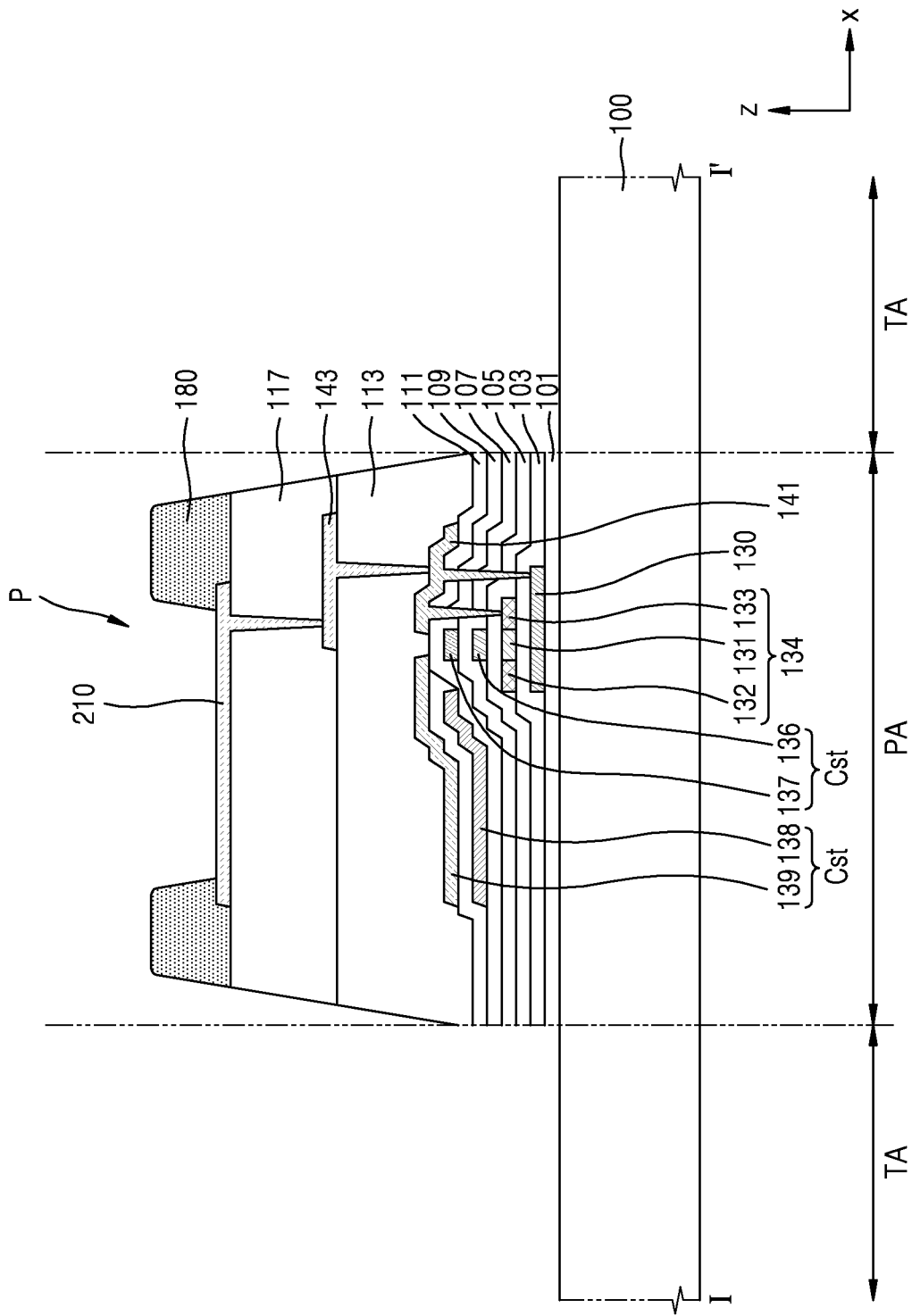
FIG. 7 is a schematic cross-sectional view schematically illustrating a display device according to an embodiment.

FIG. 7 is a schematic cross-sectional view schematically illustrating a display device according to an embodiment. The embodiment of FIG. 7 may be different from the embodiment of FIG. 5 in that a second conductive layer 137 may be arranged or disposed on a first conductive layer 136 to overlap the first conductive layer 136. With respect to the same elements of FIG. 7 as those of FIG. 5, a description thereof will be omitted, and hereinafter, only a difference therebetween will be described.

Referring to FIG. 7, the second conductive layer 137 may be arranged or disposed on the first conductive layer 136, and the first conductive layer 136 and the second conductive layer 137 may face each other with the third insulating layer 107 therebetween. The first conductive layer 136 and the second conductive layer 137 may face each other. Thus, a storage capacitor, in which the first conductive layer 136 may be a lower electrode and the second conductive layer 137 may be an upper electrode, may be configured.

Figure 8:
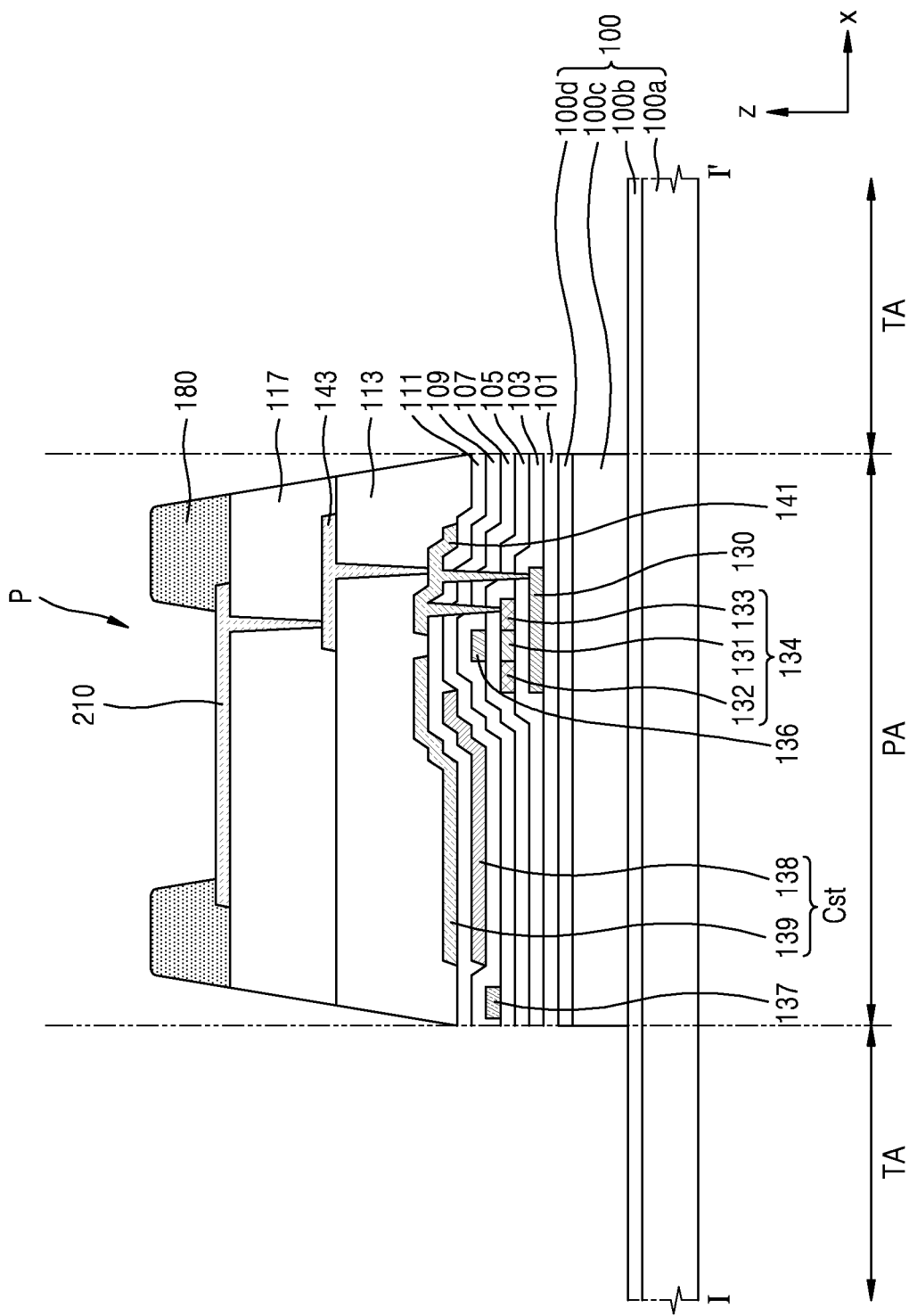
FIG. 8 is a schematic cross-sectional view schematically illustrating a display device according to an embodiment.

FIG. 8 is a schematic cross-sectional view schematically illustrating a display device according to an embodiment. The embodiment of FIG. 8 may be different from the embodiment of FIG. 5 in that part of a substrate 100 in a transmission area or areas TA when the substrate 100 includes polymer resin, may be removed. With respect to the same elements of FIG. 8 as those of FIG. 5, a description thereof will be omitted, and hereinafter, only a difference therebetween will be described.

Referring to FIG. 8, the substrate 100 arranged or disposed in a pixel area PA may include a first substrate 100a, a first barrier layer 100b arranged or disposed on the first substrate 100a, a second substrate 100c arranged or disposed on the first barrier layer 100b, and a second barrier layer 100d arranged or disposed on the second substrate 100c. The substrate 100 arranged or disposed in a transmission area TA may include the first substrate 100a and the first barrier layer 100b arranged or disposed on the first substrate 100a. For example, when a process of removing insulating layers arranged or disposed in the transmission area TA after the second substrate 100c and the second barrier layer 100d may be arranged or disposed even in the transmission area TA, is performed, the second substrate 100c and the second barrier layer 100d may be removed together.

The substrate 100 arranged or disposed to correspond to the transmission area TA may not include the second substrate 100c and the second barrier layer 100d arranged or disposed on the first substrate 100a, thus, the transmittance of the transmission area TA may be increased. The substrate 100 may include polymer resin and thus may be flexible, rollable, or bendable.

Figure 9:
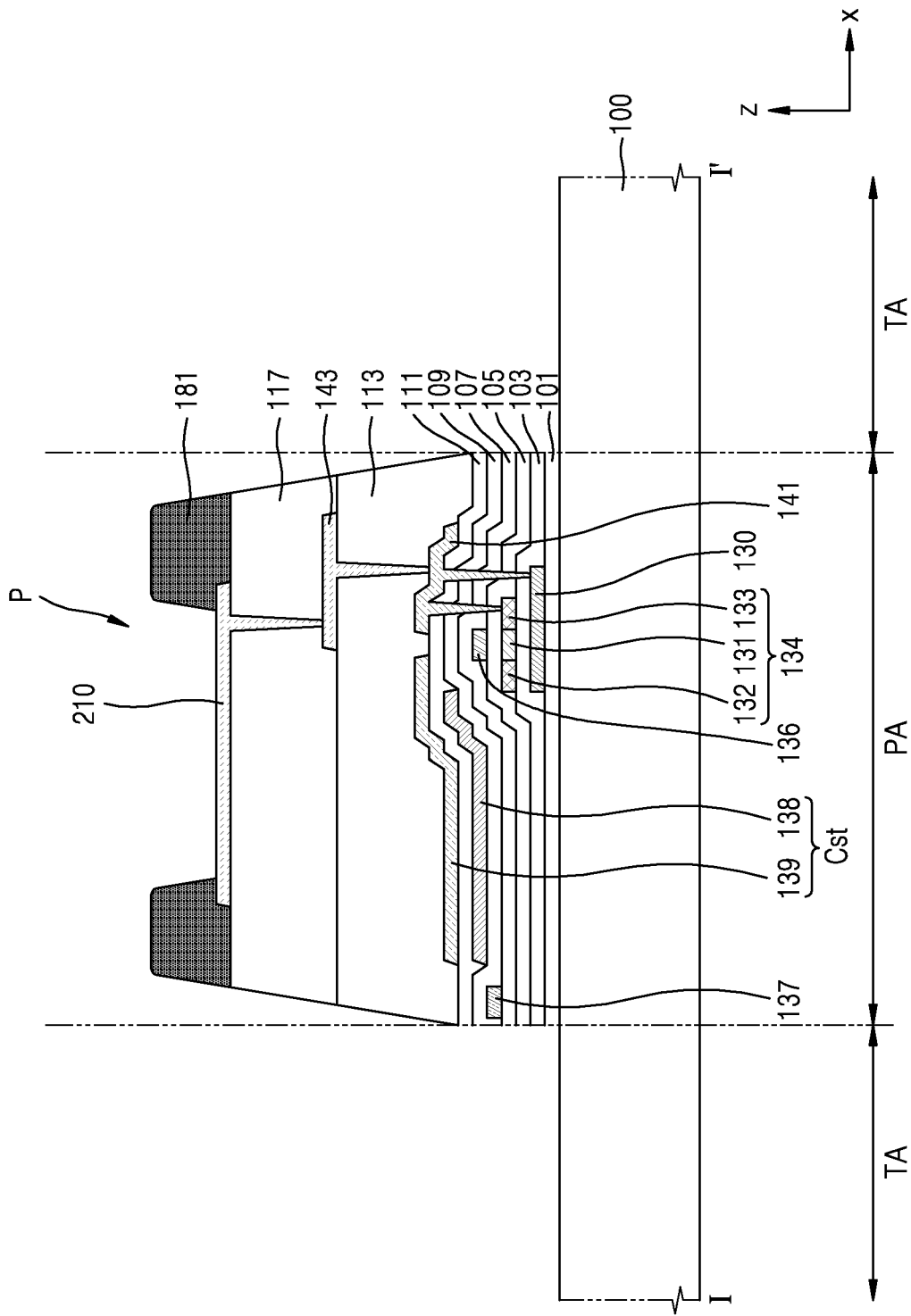
FIG. 9 is a schematic cross-sectional view schematically illustrating a display device according to an embodiment.

FIG. 9 is a schematic cross-sectional view schematically illustrating a display device according to an embodiment. The embodiment of FIG. 9 may be different from the embodiment of FIG. 5 in that an organic layer 181 including a light-shielding material instead of the pixel-defining layer 180 may be arranged or disposed. With respect to the same elements of FIG. 9 as those of FIG. 5, a description thereof will be omitted, and hereinafter, only a difference therebetween will be described.

Referring to FIG. 9, a second planarization layer 117 may be arranged or disposed on the substrate 100, and a pixel electrode 210 may be arranged or disposed on the second planarization layer 117, and the organic layer 181 exposing at least part of the pixel electrode 210 may be arranged or disposed on the second planarization layer 117. The organic layer 181 may include a light-shielding material, and the light-shielding material may include a black matrix. The black matrix may include a variety of materials, for example, an organic material with a mixture of black pigments, Cr, chromium oxide ($CrO_x$), and other suitable materials within the spirit and the scope of the disclosure. When the black matrix includes Cr or $CrO_x$, the black matrix may have a single layer or multi-layer structure of Cr and $CrO_x$. When the display device includes the black matrix, external light reflection may be sufficiently prevented.

Figure 10:
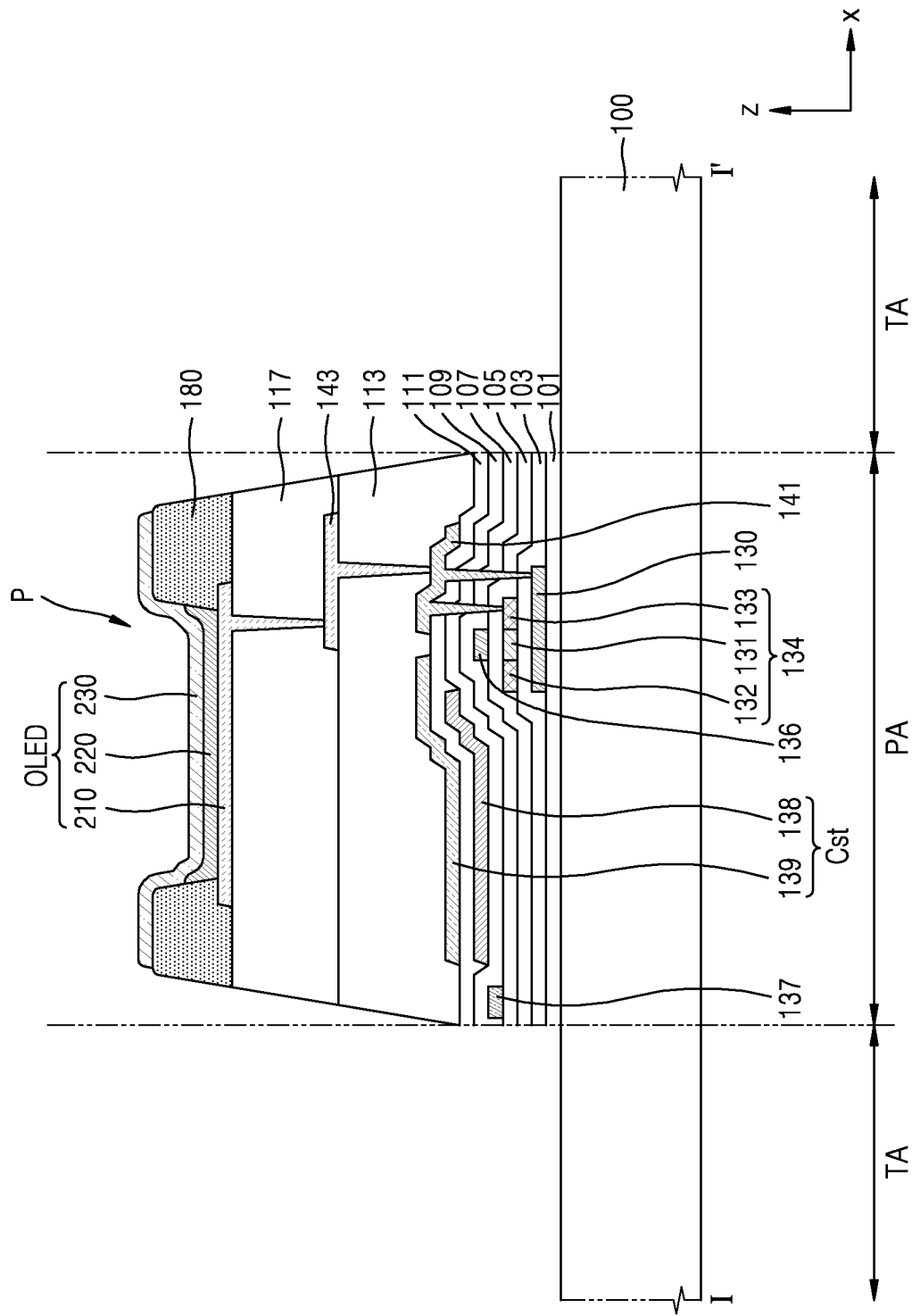
FIG. 10 is a schematic cross-sectional view schematically illustrating a display device according to an embodiment.

FIG. 10 is a schematic cross-sectional view schematically illustrating a display device according to an embodiment. The embodiment of FIG. 10 may be different from the embodiment of FIG. 5 in that an intermediate layer 220 and an opposite electrode 230 may be arranged or disposed on a pixel electrode 210. With respect to the same elements of FIG. 10 as those of FIG. 5, a description thereof will be omitted, and hereinafter, only a difference therebetween will be described.

Referring to FIG. 10, the intermediate layer 220 may be arranged or disposed on the pixel electrode 210 having at least part thereof exposed by the pixel-defining layer 180. The intermediate layer 220 may include an emission layer and may include functional layers, such as a hole transport layer (HTL), a hole injection layer (HIL), an electron transport layer (ETL), and an electron injection layer (EIL), which may be optionally arranged or disposed under or below and on the emission layer.

The emission layer may include an organic material including a fluorescent or phosphorescent material for emitting red, green, blue, or white light. The emission layer may include a small molecular weight organic material or polymer organic material.

When the emission layer includes a small molecular weight material, the intermediate layer 220 may have a structure in which an HIL, an HTL, an EML, an ETL and an EIL may be stacked in a single or composite structure, and may include various organic materials, such as copper phthalocyanine (CuPc) that is a small molecular weight organic material, N,N'-Di(napthalene-1-yl)-N,N'-diphenylbenzidine: NPB), and tris-8-hydroxyquinoline aluminum) (Alq3)). These layers may be formed, for example, using a method such as vacuum deposition.

When the emission layer includes a polymer material, the intermediate layer 220 may have a structure usually including an HTL and the EML. In this case, the HTL may include poly(3,4-ethylenedioxythiophene) (PEDOT), and the EML may include polymer materials, such as poly-phenylene vinylene-based polymer and polyfluorene-based polymer. The emission layer may be formed using screen printing or inkjet printing, or laser induced thermal imaging (LITI).

The opposite electrode 230 may be arranged or disposed on the intermediate layer 220. The opposite electrode 230 may be arranged or disposed on the intermediate layer 220 to entirely cover or overlap the intermediate layer 220. The opposite electrode 230 may be arranged or disposed in an upper portion of the pixel area PA to entirely cover or overlap the pixel area PA. For example, the opposite electrode 230 may be formed as a single body to cover or overlap the pixels P arranged or disposed in the pixel area PA. In an embodiment, although not shown, at least part of the opposite electrode 230 may extend into the transmission areas TA and thus may also be arranged or disposed in the transmission areas TA.

FIGS. 11A through 11H are cross-sectional views schematically illustrating part of a process of manufacturing a display device according to an embodiment.

Hereinafter, a method of manufacturing a display device will be sequentially described with reference to FIGS. 11A through 11H.

Referring to FIGS. 11A through 11H, the method of manufacturing the display device according to an embodiment may include preparing a substrate 100 including a pixel area PA and transmission areas TA, forming insulating layers in the pixel area PA and in the transmission areas TA, forming a pixel electrode 210 on the insulating layers in the pixel area PA and forming a pixel-defining layer 180 on the pixel electrode 210, wherein the pixel-defining layer 180 may expose at least part of the pixel electrode 210, forming a metal layer 300 on the pixel-defining layer 180 in the pixel area PA, on the pixel electrode 210 having at least part thereof exposed by the pixel-defining layer 180 in the pixel area PA and on the insulating layers in the transmission areas TA, removing the metal layer 300 on the insulating layers in the transmission areas TA, and removing the insulating layers in the transmission areas TA, and may include removing the metal layer 300 on the pixel-defining layer 180 in the pixel area PA and on the pixel electrode 210 having at least part thereof exposed by the pixel-defining layer 180 in the pixel area PA.

Figure 11A:
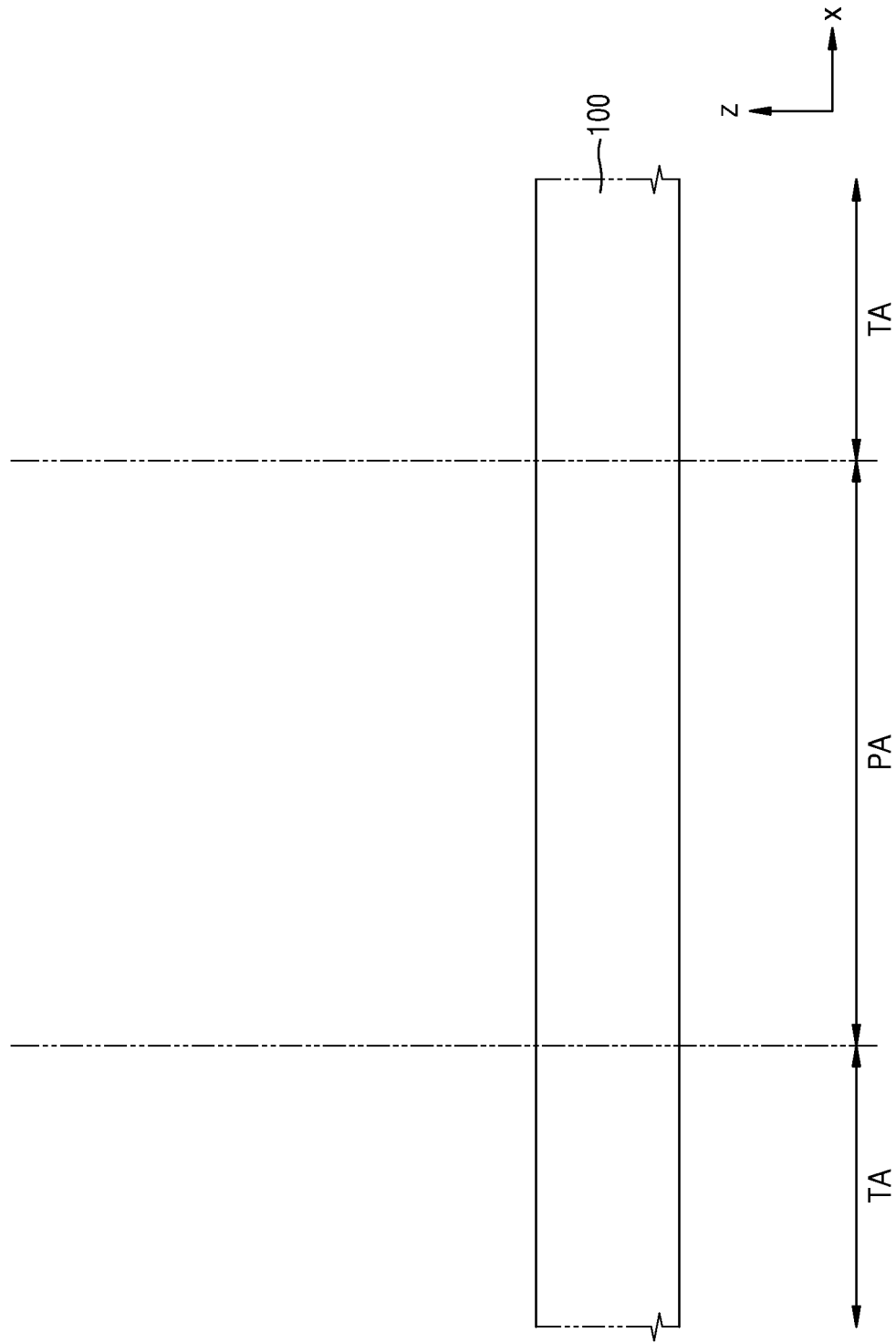

Referring to FIG. 11A, the substrate 100 may include the pixel area PA and the transmission areas TA. The substrate 100 may include a glass material having a main component of $SiO_2$ or polymer resin. The polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the polymer resin described above and an inorganic layer (not shown).

Referring to FIG. 11B, after the preparing of the substrate 100 including the pixel area PA and the transmission areas TA is performed, forming the insulating layers in the pixel area PA and in the transmission areas TA may be performed. The forming of the insulating layers in the pixel area PA and in the transmission areas TA may include forming a buffer layer 101 in the pixel area PA and in the transmission areas TA, forming a light-shielding layer 130 on the buffer layer 101 in the pixel area PA, forming a first insulating layer 103 on the light-shielding layer 130 in the pixel area PA and on the buffer layer 101 in the transmission areas TA, forming a semiconductor layer 134 on the first insulating layer 103 in the pixel area PA, forming a second insulating layer 105 on the semiconductor layer 134 in the pixel area PA and on the first insulating layer 103 in the transmission areas TA, forming a first conductive layer 136 on the second insulating layer 105 in the pixel area PA, forming a third insulating layer 107 on the first conductive layer 136 in the pixel area PA and on the second insulating layer 105 in the transmission areas TA, forming a second conductive layer 137 on the third insulating layer 107 in the pixel area PA, forming a fourth insulating layer 109 on the second conductive layer 137 in the pixel area PA and on the third insulating layer 107 in the transmission areas TA, forming a third conductive layer 138 on the fourth insulating layer 109 in the pixel area PA, forming a fifth insulating layer 111 on the third conductive layer 138 in the pixel area PA and on the fourth insulating layer 109 in the transmission areas TA, and forming a fourth conductive layer 139 and a fifth conductive layer 141 on the fifth insulating layer 111 in the pixel area PA.

The buffer layer 101 may be arranged or disposed on the substrate 100, may reduce or prevent penetration of foreign substances, moisture or external air from a lower portion of the substrate 100, and may provide a flat surface on the substrate 100. The buffer layer 101 may include an inorganic material such as oxide or nitride, an organic material, or an organic/inorganic composite material and may have a single layer or multi-layer structure of the inorganic material and the organic material. A barrier layer (not shown) for preventing penetration of external air may be arranged or disposed between the substrate 100 and the buffer layer 101.

The light-shielding layer 130 may be arranged or disposed to correspond to a thin-film transistor and may prevent a gate electrode, a source electrode, and a drain electrode of the thin-film transistor from being observed from the outside. In an embodiment, the forming of the light-shielding layer 130 may also be omitted.

The first insulating layer 103, the second insulating layer 105, the third insulating layer 107, the fourth insulating layer 109, and the fifth insulating layer 111 may include at least one inorganic insulating material selected from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103, the second insulating layer 105, the third insulating layer 107, the fourth insulating layer 109, and the fifth insulating layer 111 may have a single layer or multi-layer structure including the inorganic materials described above.

The first conductive layer 136, the second conductive layer 137, the third conductive layer 138, the fourth conductive layer 139, and the fifth conducive layer 141 may have a single layer or multi-layer structure including one or more metals selected from among Al, Pt, Pd, Ag, Mg, Au, Ni, Nd, Ir, Cr, Li, Ca, Mo, Ti, W, and Cu.

The third conductive layer 138 and the fourth conductive layer 139 may face each other with the fifth insulating layer 111 therebetween. The third conductive layer 138 and the fourth conductive layer 139 may face each other so that the storage capacitor Cst may be configured. The third conductive layer 138 and the fourth conductive layer 139 may be configured to form the storage capacitor Cst with a large area. Thus, the accumulated capacity of the storage capacitor Cst may be increased.

Referring to FIG. 11C, after the forming of the insulating layers in the pixel area PA and in the transmission areas TA is performed, forming of planarization layers in the pixel area PA may be performed.

In an embodiment, the forming of the planarization layers in the pixel area PA may include forming a first planarization layer 113 on the fourth conductive layer 139 and the fifth conductive layer 141 in the pixel area PA, forming a sixth conductive layer 143 on the first planarization layer 113 in the pixel area PA, and forming a second planarization layer 117 on the sixth conductive layer 143 in the pixel area PA.

The first planarization layer 113 and the second planarization layer 117 may have a single layer or multi-layer structure including organic materials or inorganic materials. The first planarization layer 113 and the second planarization layer 117 may include general-purpose polymer, such as BCB, polyimide, HMDSO, PMMA, or PS, a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof. Moreover, the second planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the first planarization layer 113 and the second planarization layer 117 are formed, chemical and mechanical polishing may be performed to provide a flat top surface.

Figure 11D:
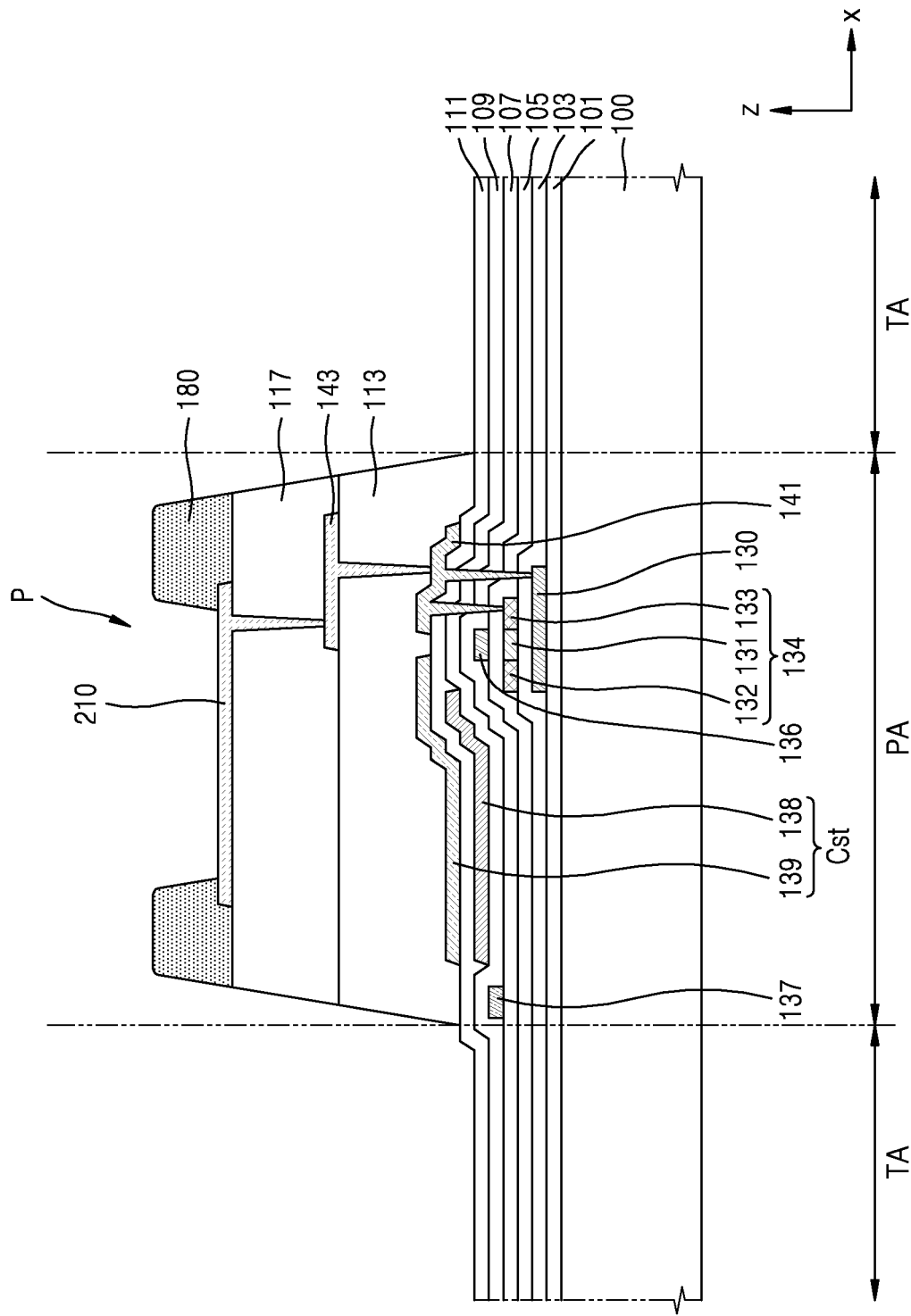

Referring to FIG. 11D, after the forming of the planarization layers in the pixel area PA is performed, forming a pixel electrode 210 on the planarization layers in the pixel area PA and forming a pixel-defining layer 180 on the pixel electrode 210 may be performed, wherein the pixel-defining layer 180 may expose at least part of the pixel electrode 210.

The pixel electrode 210 may include a (semi-)light-transmitting electrode or reflective electrode. The pixel electrode 210 may include a reflective layer including Ag, Mg, Al, Pt, Pd, Au, Ni, Nd, Ir, Cr, and a compound thereof and a transparent or (semi-)transparent electrode layer on the reflective layer. The transparent or (semi-)transparent electrode layer may include at least one selected from among ITO, IZO, ZnO, $In_2O_3$, IGO, and AZO. The pixel electrode 210 may have a stacked structure of ITO/Ag/ITO. The pixel-defining layer 180 may have an opening exposing at least part of the pixel electrode 210. The pixel-defining layer 180 may increase a distance between ends of the pixel electrode 210 and the opposite electrode (see 230 of FIG. 10) at an upper portion of the pixel electrode 210. Thus, an arc may be prevented from occurring in the ends of the pixel electrode 210. The pixel-defining layer 180 may include organic insulating materials, such as polyimide, polyamide, acryl resin, BCB, HMDSO, and phenol resin using a method such as spin coating, for example.

Figure 11E:
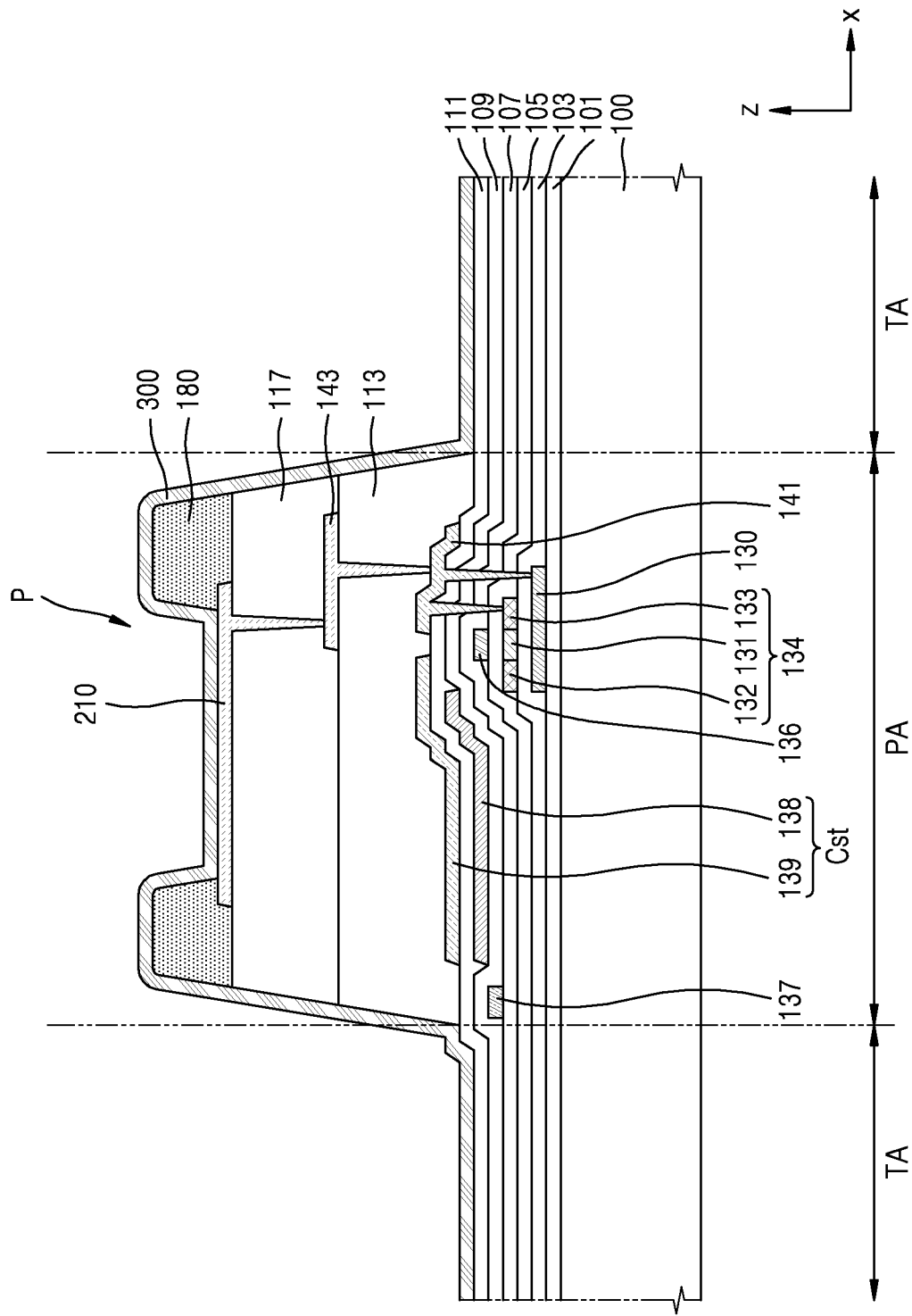

Referring to FIG. 11E, after the forming of the pixel electrode 210 on the insulating layers in the pixel area PA and the forming of the pixel-defining layer 180 on the pixel electrode 210, wherein the pixel-defining layer 180 may expose at least part of the pixel electrode 210, are performed, forming a metal layer 300 on the pixel-defining layer 180 in the pixel area PA, on the pixel electrode 210 having at least part thereof exposed by the pixel-defining layer 180 in the pixel area PA, and on the insulating layers in the transmission area TA may be performed.

In the forming of the metal layer 300 on the pixel-defining layer 180 in the pixel area PA, on the pixel electrode 210 having at least part thereof exposed by the pixel-defining layer 180 in the pixel area PA, and on the insulating layers in the transmission areas TA, the metal layer 300 may be arranged or disposed on the pixel-defining layer 180 in the pixel area PA, on the pixel electrode 210 having at least part thereof exposed by the pixel-defining layer 180, and on the fifth insulating layer 111 in the transmission areas TA. The metal layer 300 may have a thickness in a range of about 400 Å to about 1200 Å. In an embodiment, the metal layer 300 may include at least one of IZO, ITO, ZnO, $In_2O_3$, IGO, and AZO.

Figure 11F:
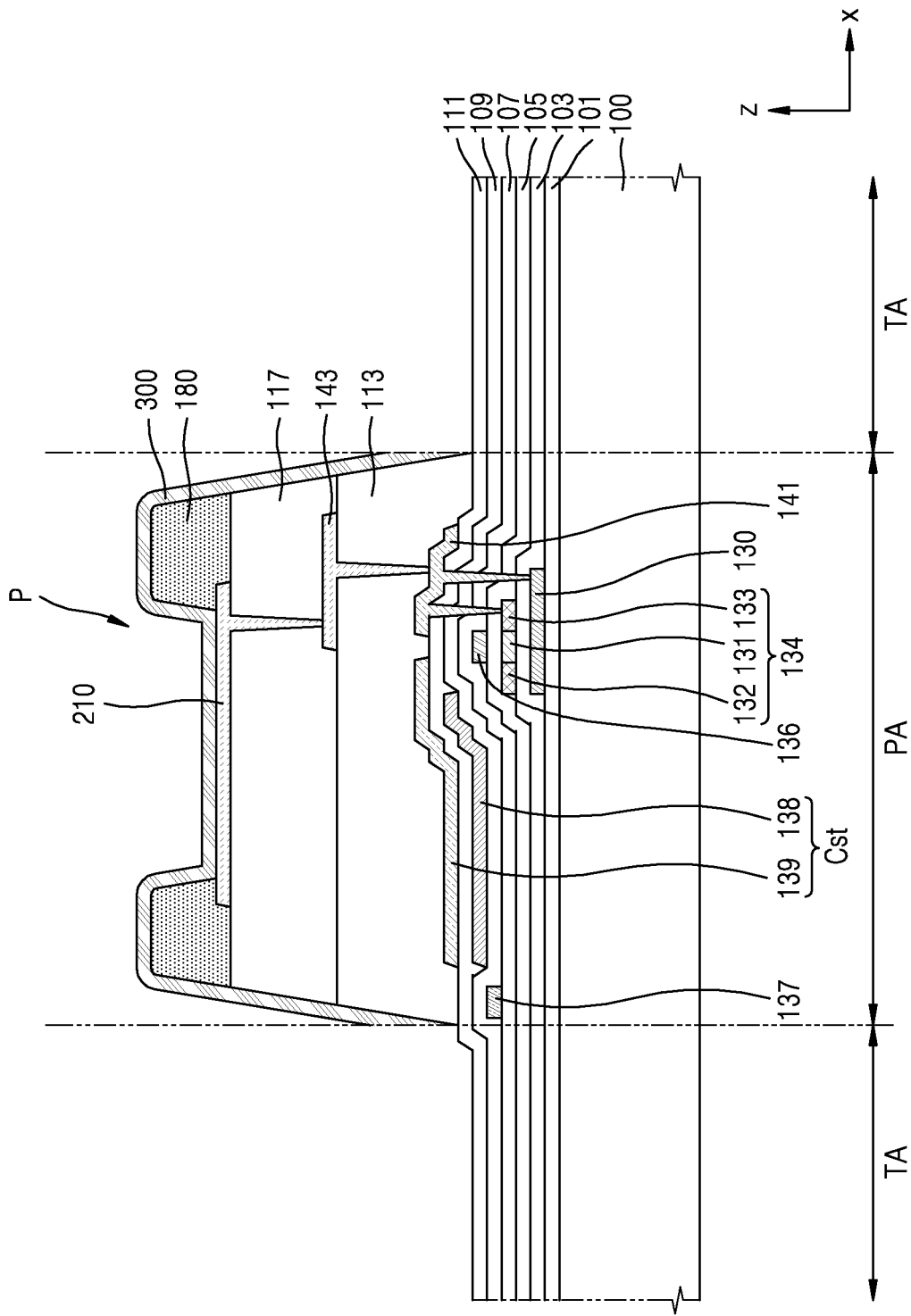

Referring to FIG. 11F, after the forming of the metal layer 300 on the pixel-defining layer 180 in the pixel area PA, on the pixel electrode 210 having at least part thereof exposed by the pixel-defining layer 180 in the pixel area PA, and on the insulating layers in the transmission areas TA is performed, removing the metal layer 300 on the insulating layers in the transmission area or areas TA may be performed.

The removing of the metal layer 300 on the insulating layers in the transmission areas TA may include patterning a photosensitive material on the metal layer 300 in the pixel area PA, removing the metal layer 300 on the insulating layers in the transmission areas TA, and removing the patterned photosensitive material on the metal layer 300 in the pixel area PA. For example, the metal layer 300 on the insulating layers in the transmission areas TA may be removed using a wet etching process.

Figure 11G:
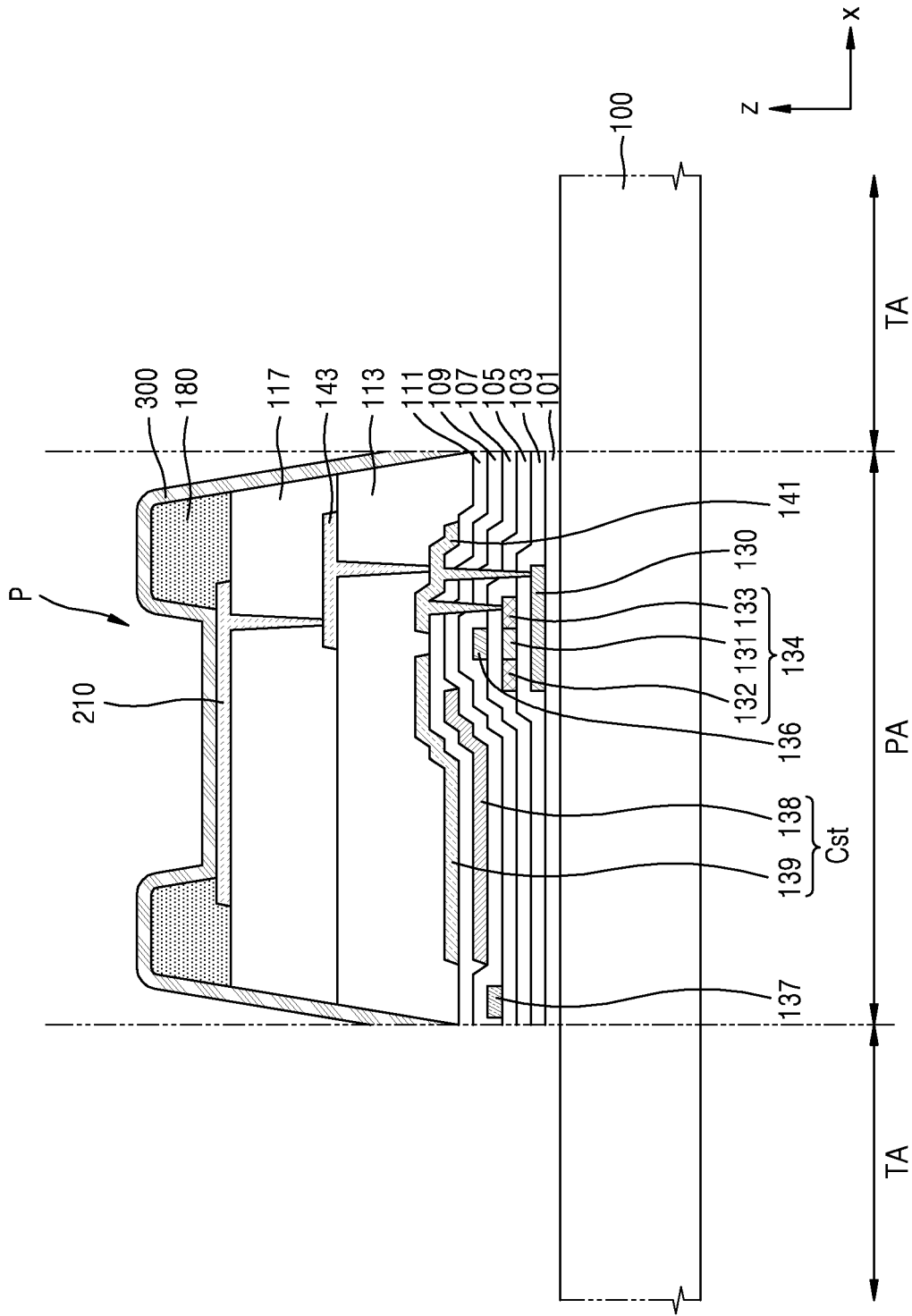

Referring to FIG. 11G, after the removing of the metal layer 300 on the insulating layers in the transmission areas TA is performed, removing the insulating layers in the transmission areas TA may be performed.

In more detail, the buffer layer 101, the first insulating layer 103, the second insulating layer 105, the third insulating layer 107, the fourth insulating layer 109, and the fifth insulating layer 111, which may be arranged or disposed in the transmission areas TA, may be removed using a dry etching process. For example, the metal layer 300 on the pixel-defining layer 180 in the pixel area PA and on the pixel electrode 210 having at least part thereof exposed by the pixel-defining layer 180, may protect the planarization layers, the pixel-defining layer 180, and the pixel electrode 210. Thus, the organic materials used to form the planarization layers and the pixel-defining layer 180 may be prevented from being lost in the dry etching process, and the pixel electrode 210 may be prevented from being damaged.

Figure 11H:
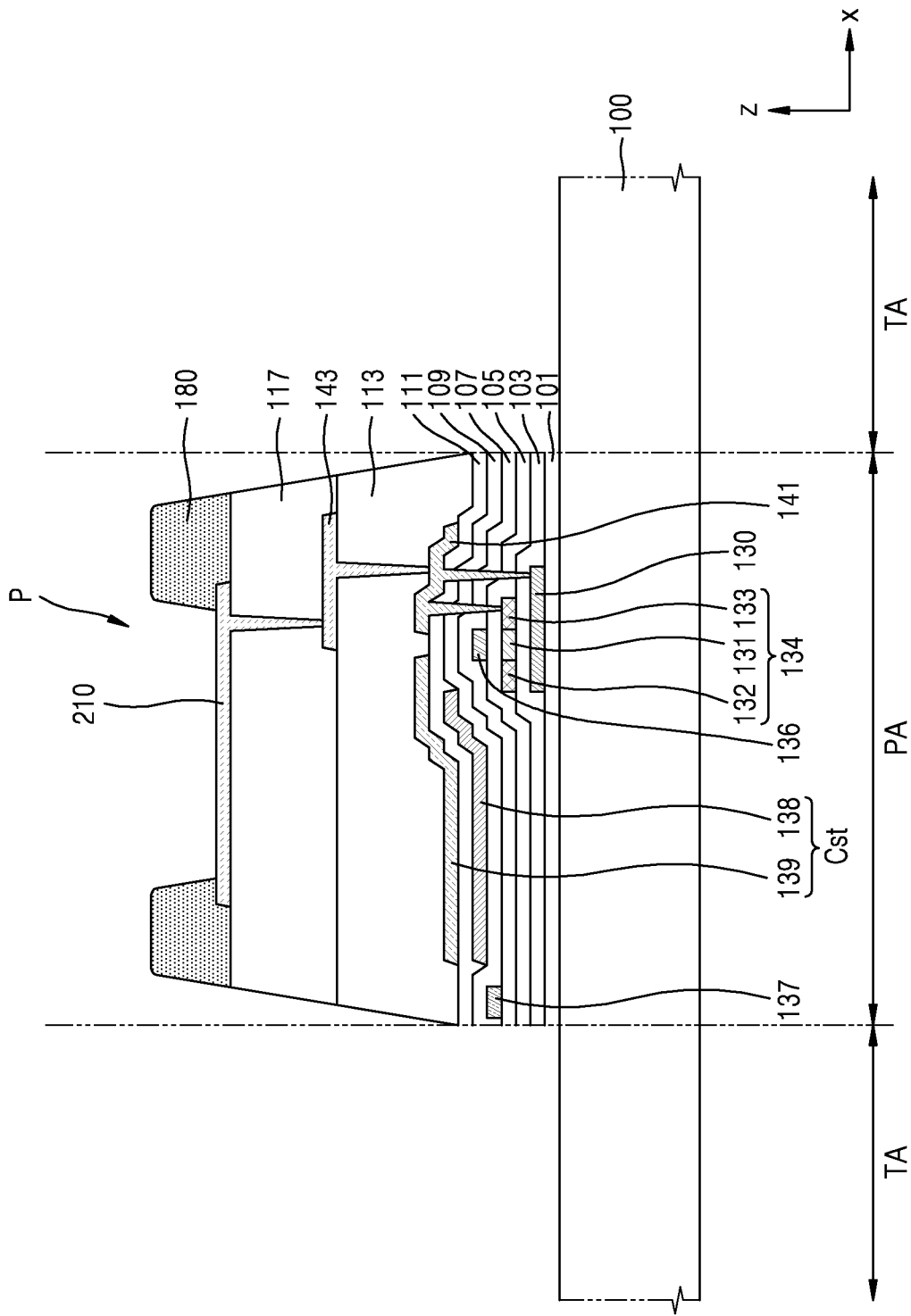

Referring to FIG. 11H, after the removing of the insulating layers in the transmission areas TA is performed, removing the metal layer 300 on the pixel-defining layer 180 in the pixel area PA and on the pixel electrode 210 having at least part thereof exposed by the pixel-defining layer 180 in the pixel area PA may be performed.

In the removing of the metal layer 300 on the pixel-defining layer 180 in the pixel area PA and on the pixel electrode 210 having at least part thereof exposed by the pixel-defining layer 180 in the pixel area PA, the metal layer 300 may be removed using a wet etching process, for example.

After the removing of the metal layer 300 on the pixel-defining layer 180 in the pixel area PA and on the pixel electrode 210 having at least part thereof exposed by the pixel-defining layer 180 in the pixel area PA is performed, forming the intermediate layer (see 220 of FIG. 10) on the pixel electrode 210 and forming the opposite electrode (see 230 of FIG. 10) on the intermediate layer 220 may be performed.

The intermediate layer 220 may be formed on the pixel electrode 210 having at least part thereof exposed by the pixel-defining layer 180. The intermediate layer 220 may include an emission layer and may include functional layers, such as an HTL, an HIL, an ETL, and an EIL, which may be optionally arranged or disposed under or below and on the emission layer.

The opposite electrode 230 may be formed on the intermediate layer 220. The opposite electrode 230 may be formed on the intermediate layer 220 to entirely cover or overlap the intermediate layer 220. The opposite electrode 230 may be arranged or disposed in an upper portion of the pixel area PA to entirely cover or overlap the pixel area PA. For example, the opposite electrode 230 may be formed as a single body to cover or overlap the pixels P arranged or disposed in the pixel area PA. In an embodiment, although not shown, at least part of the opposite electrode 230 may extend into the transmission areas TA and may be arranged or disposed in the transmission areas TA.

Insulating layers and planarization layers may be arranged or disposed in the pixel area PA, and not in the transmission areas TA. Thus, the pixel area PA may have the first transmittance, and the transmission areas TA may have the second transmittance that may be higher than the first transmittance.

By removing IZO using only a wet etching process, the metal layer 300 including IZO may protect the planarization layers, the pixel-defining layer 180, and the pixel electrode 210 in the pixel area PA when a process of removing insulating layers in the transmission area or areas TA using a dry etching process is performed. Thus, the organic materials used to form the planarization layers and the pixel-defining layer 180 may be prevented from being lost in the dry etching process, and the pixel electrode 210 may be prevented from being damaged. In addition, the insulating layers in the transmission areas TA may be removed so that transmittance of a display device may be increased.

As described above, in one or more embodiments, the display device in which a loss of the organic materials may be prevented and simultaneously high transmittance may be achieved, may be implemented. The scope of the disclosure, however, is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
preparing a substrate including a pixel area and a transmission area;
forming a plurality of insulating layers in the pixel area and in the transmission area;
forming a pixel electrode on the plurality of insulating layers in the pixel area;
forming a pixel-defining layer on the pixel electrode, wherein the pixel-defining layer exposes at least part of the pixel electrode;
forming a metal layer on:
the pixel-defining layer in the pixel area,
the at least part of the pixel electrode exposed by the pixel-defining layer in the pixel area, and
the plurality of insulating layers in the transmission area;
removing the metal layer on the plurality of insulating layers in the transmission area;
removing the plurality of insulating layers in the transmission area; and
removing the metal layer on:
the pixel-defining layer in the pixel area; and
the at least part of the pixel electrode exposed by the pixel-defining layer in the pixel area.

2. The method of claim 1, wherein, the forming of the metal layer including forming the metal layer of a thickness in a range of about 400 Å to about 1200 Å.

3. The method of claim 2, wherein the metal layer comprises at least one of indium zinc oxide (IZO), indium tin oxide (ITO), zinc oxide (ZnO), indium oxide ($In_2O_3$), indium gallium oxide (IGO), and aluminum zinc oxide (AZO).

4. The method of claim 1, wherein the removing of the metal layer on the plurality of insulating layers in the transmission area comprises:
patterning a photosensitive material on the metal layer in the pixel area;
removing the metal layer on the plurality of insulating layers in the transmission area; and
removing the patterned photosensitive material on the metal layer in the pixel area.

5. The method of claim 4, wherein the removing of the metal layer on the plurality of insulating layers in the transmission area comprises removing the metal layer in the transmission area by wet etching.

6. The method of claim 1, wherein the removing of the plurality of insulating layers in the transmission area comprises removing the plurality of insulating layers in the transmission area by dry etching.

7. The method of claim 1, wherein the removing of the metal layer on the pixel-defining layer in the pixel area and on the at least part of the pixel electrode exposed by the pixel-defining layer in the pixel area comprises removing the metal layer by wet etching.

8. The method of claim 1, wherein forming of the plurality of insulating layers in the pixel area and in the transmission area comprises:

forming a buffer layer in the pixel area and in the transmission area;

forming a light-shielding layer on the buffer layer in the pixel area;

forming a first insulating layer on the light-shielding layer in the pixel area and on the buffer layer in the transmission area;

forming a semiconductor layer on the first insulating layer in the pixel area;

forming a second insulating layer on the semiconductor layer in the pixel area and on the first insulating layer in the transmission area;

forming a first conductive layer on the second insulating layer in the pixel area;

forming a third insulating layer on the first conductive layer in the pixel area and on the second insulating layer in the transmission area;

forming a second conductive layer on the third insulating layer in the pixel area;

forming a fourth insulating layer on the second conductive layer in the pixel area and on the third insulating layer in the transmission area;

forming a third conductive layer on the fourth insulating layer in the pixel area;

forming a fifth insulating layer on the third conductive layer in the pixel area and on the fourth insulating layer in the transmission area; and forming a fourth conductive layer and a fifth conductive layer on the fifth insulating layer in the pixel area.

9. The method of claim 8, further comprising:

forming a first planarization layer on the fourth conductive layer and the fifth conductive layer in the pixel area;

forming a sixth conductive layer on the first planarization layer in the pixel area; and forming a second planarization layer on the sixth conductive layer in the pixel area.

10. The method of claim 9, wherein the forming of the fourth conductive layer comprises forming the fourth conductive layer to face the third conductive layer.

11. The method of claim 8, wherein the forming of the second conductive layer comprises forming the second conductive layer to face the first conductive layer.

12. The method of claim 1, further comprising:

forming an intermediate layer on the pixel electrode after removing the metal layer on the at least part of the pixel electrode exposed by the pixel-defining layer in the pixel area; and forming an opposite electrode on the intermediate layer.

13. The method of claim 12, wherein the forming of the opposite electrode comprises forming the opposite electrode to extend into the transmission area.

14. The method of claim 1, wherein the pixel area has a first transmittance, and the transmission area has a second transmittance higher than the first transmittance.

15. A display device comprising:

a substrate comprising a pixel area and a transmission area;

a plurality of insulating layers disposed in the pixel area;

a plurality of planarization layers disposed on the plurality of insulating layers;

a pixel electrode disposed on the plurality of planarization layers; and a pixel-defining layer disposed on the pixel electrode and exposing at least part of the pixel electrode, wherein the plurality of insulating layers in the transmission area are removed, and wherein the plurality of insulating layers comprise:

a first insulating layer disposed on the substrate;

a second insulating layer disposed on the first insulating layer;

a third insulating layer disposed on the second insulating layer;

a fourth insulating layer disposed on the third insulating layer; and a fifth insulating layer disposed on the fourth insulating layer.

16. The display device of claim 15, wherein the plurality of planarization layers comprise:

a first planarization layer disposed on the fifth insulating layer; and a second planarization layer disposed on the first planarization layer.

17. The display device of claim 15, further comprising:

an intermediate layer disposed on the pixel electrode; and an opposite electrode disposed on the intermediate layer.

18. The display device of claim 17, wherein at least part of the opposite electrode extends into the transmission area.

19. The display device of claim 15, wherein the pixel area has a first transmittance, and the transmission area has a second transmittance higher than the first transmittance.

* * * * *